United States Patent
Nittala et al.

(10) Patent No.: US 11,668,612 B2
(45) Date of Patent: Jun. 6, 2023

(54) APPARATUS, SYSTEM, AND METHOD FOR TRIMMING ANALOG TEMPERATURE SENSORS

(71) Applicant: SanDisk Technologies LLC, Addison, TX (US)

(72) Inventors: Venkata Nittala, Bangalore (IN); Sridhar Yadala, Bengaluru (IN); Sivakumar Grandhi, Bangalore (IN)

(73) Assignee: SanDisk Technologies LLC, Addison, TX (US)

(*) Notice: Subject to any disclaimer, the term of this patent is extended or adjusted under 35 U.S.C. 154(b) by 414 days.

(21) Appl. No.: 16/905,711

(22) Filed: Jun. 18, 2020

(65) Prior Publication Data
US 2021/0396604 A1 Dec. 23, 2021

(51) Int. Cl.
*G01K 15/00* (2006.01)
*G11C 29/02* (2006.01)
(Continued)

(52) U.S. Cl.
CPC .......... *G01K 15/007* (2013.01); *G01K 7/00* (2013.01); *G01K 15/005* (2013.01);
(Continued)

(58) Field of Classification Search
CPC ...... G01K 15/007; G01K 7/00; G01K 15/005; G11C 29/028; G11C 7/00; G11C 7/04;
(Continued)

(56) References Cited

U.S. PATENT DOCUMENTS 5,440,305 A * 8/1995 Signore ................ G12B 13/00
341/120
9,356,590 B1 * 5/2016 da Silva, Jr. ............. G11C 7/04
(Continued)

OTHER PUBLICATIONS

Mark Redekopp, "Introduction to Digital Logic, Lecture 11: Cascading Decoders Implementing Functions w/Decoders Encoders & Priority Encoders", Retrieved from Internet URL http://ee.usc.edu/~redekopp/ee101/slides/EE101Lecture11.pdf on Mar. 12, 2020; pp. 24-33.

(Continued)

*Primary Examiner* — Nathaniel T Woodward
*Assistant Examiner* — Philip L Cotey
(74) *Attorney, Agent, or Firm* — Vierra Magen Marcus LLP

(57) ABSTRACT

A method for trimming analog temperature sensors. First, raise a temperature of a temperature sensor to a highest temperature of a qualification temperature range. Then, trim the temperature sensor such that a high temperature code generated by the temperature sensor represents an actual temperature reported by the temperature sensor at the highest temperature. Next, lower the temperature of the temperature sensor to a lowest temperature of the qualification temperature range. Determine a slope error between the high temperature code and a low temperature code generated by the temperature sensor at the lowest temperature. Finally, determine a correction function that compensates for the
(Continued)

slope error of measured temperature codes generated by the temperature sensor for temperatures across the qualification temperature range.

20 Claims, 11 Drawing Sheets

(51) Int. Cl.
| | | |
|---|---|---|
| *G01K 7/00* | (2006.01) | |
| *G11C 8/10* | (2006.01) | |
| *G11C 7/00* | (2006.01) | |
| *G11C 29/04* | (2006.01) | |
| *G11C 7/04* | (2006.01) | |
| *G11C 29/16* | (2006.01) | |
| *G11C 29/50* | (2006.01) | |
| *G11C 29/06* | (2006.01) | |

(52) U.S. Cl.
CPC .............. *G11C 29/028* (2013.01); *G11C 7/00* (2013.01); *G11C 7/04* (2013.01); *G11C 8/10* (2013.01); *G11C 29/06* (2013.01); *G11C 29/16* (2013.01); *G11C 2029/0403* (2013.01); *G11C 2029/5002* (2013.01)

(58) Field of Classification Search
CPC ........... G11C 8/10; G11C 29/06; G11C 29/16; G11C 2029/0403; G11C 2029/5002
See application file for complete search history.

(56) References Cited

U.S. PATENT DOCUMENTS

| 9,715,913 | B1* | 7/2017 | Yin ........................... G01K 7/01 |
| 9,804,036 | B2* | 10/2017 | Ma ........................... G01K 7/015 |
| 10,302,509 | B2* | 5/2019 | Pandiri ................ G01K 15/005 |
| 10,788,376 | B2* | 9/2020 | Elsayed .................... H03K 5/24 |
| 2008/0175068 | A1* | 7/2008 | Houston .............. G11C 11/413 |
| | | | 365/185.27 |
| 2013/0136149 | A1* | 5/2013 | Soenen ..................... G01K 7/16 |
| | | | 374/170 |
| 2016/0238464 | A1* | 8/2016 | Eberlein ................ G01K 15/00 |
| 2017/0082505 | A1* | 3/2017 | Matsumoto .............. G01K 7/01 |
| 2017/0257113 | A1* | 9/2017 | Singh ........................ G01K 7/01 |
| 2018/0292271 | A1* | 10/2018 | Ma ........................ G01R 35/005 |
| 2018/0335813 | A1* | 11/2018 | Zhang .................... G05B 15/02 |
| 2019/0044528 | A1* | 2/2019 | Lu ............................. G01K 7/14 |
| 2021/0149564 | A1* | 5/2021 | Luo ........................... G11C 7/04 |
| 2021/0342100 | A1* | 11/2021 | Cerafogli ............. G11C 29/021 |

OTHER PUBLICATIONS

Thomas H. Lee, "Handout #20: EE214 Fall 2002 Voltage References and Biasing", published on internet @ https://web.stanford.edu/class/archive/ee/ee214/ee214.1032/Handouts/ho20bg.pdf 1993, revised Nov. 2002, p. 2-7.

* cited by examiner

US 11,668,612 B2

APPARATUS, SYSTEM, AND METHOD FOR TRIMMING ANALOG TEMPERATURE SENSORS

BACKGROUND

As on-die memory capacity expands while die size shrinks, physical parameters such as die temperature may play an increasing role in memory die and memory cell behavior. For this reason, memory dies may be manufactured with on-die temperature sensor circuits, and die temperature data may be used in controlling NAND operation parameters such as read time, detecting a cross-temperature condition, programming parameters, dynamic output impedance (ZQ) calibration, reference current for zero temperature calibration (ZTC) of input/output (IO) circuits, etc.

On-die temperature sensor circuitry is also vulnerable to behavior changes based on temperature fluctuations. An ideal sensor may provide a readout that increases along a linear slope as temperature increases linearly, a one-to-one direct correlation. However, the slope of temperature readout for on-die temperature sensors is known to no be ideal and may differ for each die manufactured. Thus, circuitry that is physically calibrated to provide an accurate reading at one temperature may not provide an accurate reading at another temperature. Indeed, sensor circuitry may incur a greater measurement error at a different temperature as a result of physical calibration at one temperature.

Physical calibration or "trimming" across the entire range of operable temperatures, or even at more than one calibration temperature, may be a lengthy a process during manufacturing and testing and may incur and undesirable amount of testing time. Thus, a solution is needed for quick calculation and application of a correction function, such that temperature measurement errors may be corrected dynamically and digitally during die operation and independent of a temperature sensor architecture the while incurring an acceptably small latency.

BRIEF SUMMARY

This disclosure relates to a method for trimming analog temperature sensors. First, raise a temperature sensor in temperature to a highest temperature of a qualification temperature range. The qualification temperature range has a lowest temperature as well as the highest temperature. Then, trim the temperature sensor such that a high temperature code generated by the temperature sensor represents an actual temperature reported by the temperature sensor at the highest temperature. Next, lower the temperature of the temperature sensor to the lowest temperature. Determine a slope error between the high temperature code and a low temperature code generated by the temperature sensor at the lowest temperature. Finally, determine a correction function that compensates for the slope error of each measured temperature code generated by the temperature sensor for temperatures across the qualification temperature range.

This disclosure further relates to an apparatus to trim analog temperature sensors. The apparatus comprises a die controller, a temperature sensor, a trimming circuit, and a tuner. The die controller executes storage operations with storage cells. The temperature sensor determines a measured temperature code proportional to a temperature sensed by the temperature sensor. The trimming circuit calibrates the measured temperature code in accordance with a baseline temperature code. The tuner generates a corrected temperature code by evaluating a correction function using the measured temperature code. In one embodiment, the correction function is based on a slope error between the measured temperature codes at a highest temperature and a lowest temperature of a qualification temperature range. The die controller uses the corrected temperature code for a temperature sensitive operation.

Finally, this disclosure relates to a method for trimming analog temperature sensors. First, measure a first temperature code with a temperature sensor at a first temperature. Then determine an ideal temperature code with the temperature sensor having the first temperature. Determine a first temperature code error between the first temperature code and the ideal temperature code. Adjust the temperature sensor such that the first temperature code error is zero. Next, measure a second temperature code with the temperature sensor at a second temperature. Determine the ideal temperature code with the temperature sensor having the second temperature. Then determine a second temperature code error between the second temperature code and the ideal temperature code for the second temperature. Next, determine a correction function in response to the second temperature code error being nonzero. Finally, store the correction function in a ROM fuse for use by a controller in tuning a temperature code measured by the temperature sensor.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

Figure 1:
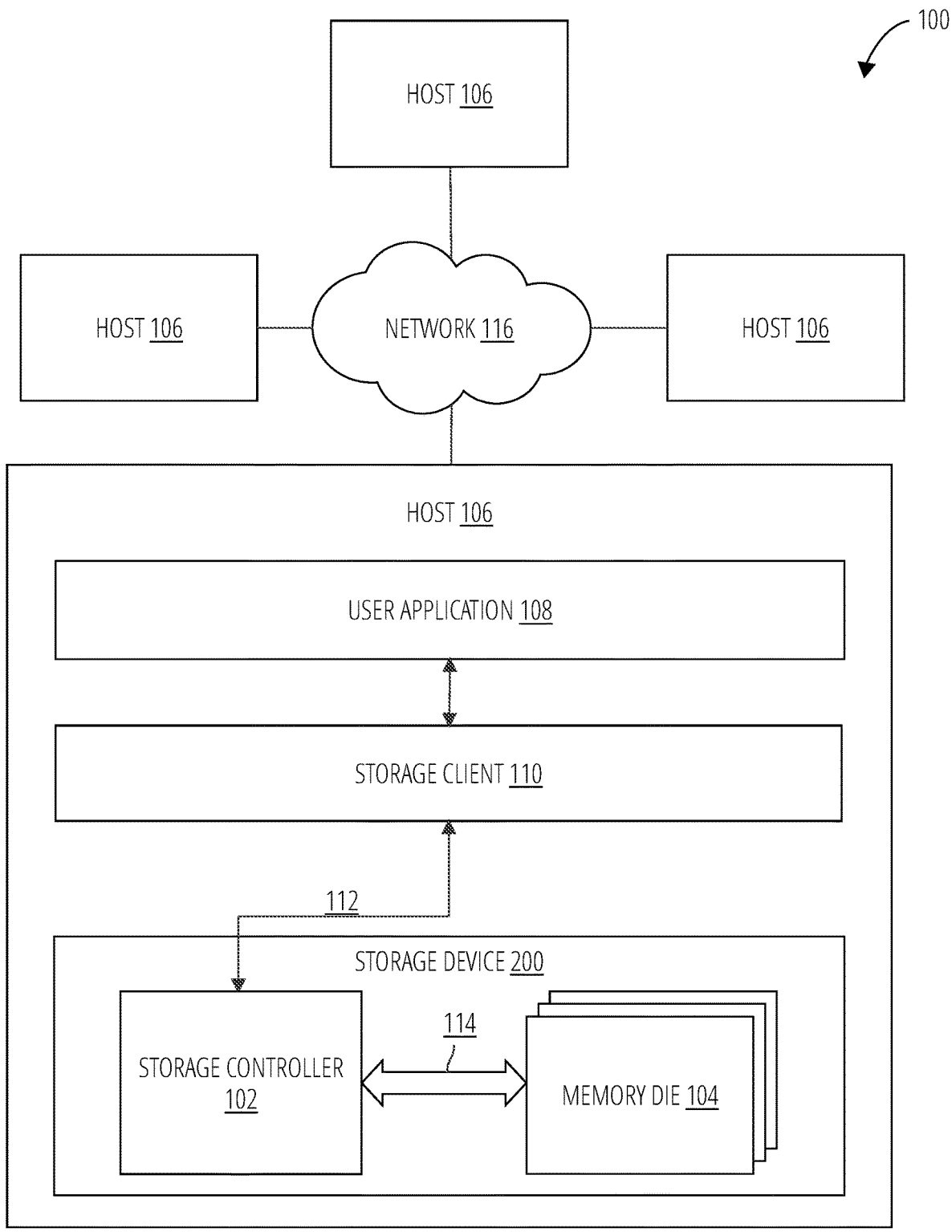
FIG. 1 illustrates a storage system 100 in accordance with one embodiment.

Temperature is a factor in how many aspects of a semiconductor operates. Semiconductors are designed to operate properly within a qualification temperature range. "Qualification temperature range" refers to a temperature range used to test, validate, configure, and/or qualify electronic devices. Typically, if the electronic devices functions within a predefined set of specifications while experiencing temperatures within the qualification temperature range, the electronic device is considered operable and fit for delivery to a customer. Based on an accurate temperature reading and/or temperature reading adjustments, certain compensating actions may be taken to ensure the semiconductor performs properly throughout a given qualification temperature range.

Temperature sensors are used to provide an accurate reading of the current temperature. "Temperature sensor" refers to a device, component, circuit, system, logic, chip, or circuitry configured to detect, sense, and/or measure a temperature of an object, an apparatus, a circuit, a component, ambient air, and/or the like. One example of a temperature sensor is a semiconductor based temperature sensor which may be fabricated together with the semiconductor.

Temperature sensors are also electronic devices, circuits, or components and are also subject to deviations, variations, and errors in operations as the ambient temperature changes. Consequently, components of a temperature sensor are adjusted, tuned, and/or compensation values are determined, to ensure that the temperature sensor provides an accurate temperature, despite Process variations, Voltage variations, and Temperature variations (PVT) or other nonidealities. The determination of the compensating values, settings, parameters, and the like to manage PVT and nonidealities and obtain an accurate temperature reading from the temperature sensor are known as trimming or adjusting a circuit or components of a circuit.

Temperature sensors may be analog circuits and may include a trimming circuit configured to correct or mitigate errors in a sensed/measured temperature from the temperature sensor. "Trimming circuit" refers to a device, component, element, circuitry, logic, hardware, or circuit configured to adjust a setting, characteristic, parameter, attribute, or the like in a manner that improves performance, accuracy, and/or operation of a set of logic, circuit, software, hardware, firmware, system, sub-system, device, apparatus, or logic unit, component, device, or component.

During manufacture of semiconductors, the manufactured integrated circuit (IC), IC device, chip, component, or the like, may undergo a quality check and adjustment or trimming process, known as die sort. During die sort, tests are run on the IC device, and adjustments or trimming may be performed to ensure that the device operates within specification parameters. Conventional solutions include hardware for correcting the temperature code at both the highest temperature and the lowest temperature, and conventional methods include trim temperature sensor hardware for both a highest temperature of a qualification temperature range and at a lowest temperature of the qualification temperature range. Conventional implementations that use trimming circuits for both the highest temperature and a lowest temperature of the qualification temperature range use up valuable space on the semiconductor chip and analog/hardware trimming for the lowest temperature may re-introduce errors at the highest temperature.

FIG. 1 is a schematic block diagram illustrating one embodiment of a storage system 100 that includes a storage device in accordance with the disclosed solution. The storage system 100 comprises a storage device 200, a storage controller 102, a memory die 104, a host 106, a user application 108, a storage client 110, a data bus 112, a bus 114, and a network 116. "Host" refers to any computing device or computer device or computer system configured to send and receive storage commands. Examples of a host include, but are not limited to, a computer, a laptop, a mobile device, an appliance, a virtual machine, an enterprise server, a desktop, a tablet, a main frame, and the like.

"Storage command" refers to any command relating with a storage operation. Examples of storage commands include, but are not limited to, read commands, write commands, maintenance commands, configuration command, administration command, diagnostic commands, test mode commands, countermeasure command, and any other command a storage controller may receive from a host or issue to another component, device, or system.

"Storage operation" refers to an operation performed on a storage cell, or memory cell, in order to change, or obtain, the value of data represented by a state characteristic of the storage cell. Examples of storage operations include but are not limited to reading data from (or sensing a state of) a storage cell, writing (or programming) data to a storage cell, and/or erasing data stored in a storage cell.

"Write command" refers to a storage command configured to direct the recipient to write, or store, one or more data blocks on a persistent storage media, such as a hard disk drive, non-volatile memory media, or the like. A write command may include any storage command that may result in data being written to physical storage media of a storage device. The write command may include enough data to fill one or more data blocks, or the write command may include enough data to fill a portion of one or more data blocks. In one embodiment, a write command includes a starting LBA and a count indicating the number of LBA of data to write to on the storage media.

The storage system 100 includes at least one storage device 200, comprising a storage controller 102 and one or more memory die 104, connected by a bus 114. "Storage controller" refers to any hardware, device, component, element, or circuit configured to manage data operations on non-volatile memory media, and may comprise one or more processors, programmable processors (e.g., FPGAs), ASICs, micro-controllers, or the like. In some embodiments, the storage controller is configured to store data on and/or read data from non-volatile memory media, to transfer data to/from the non-volatile memory device(s), and so on.

"Memory die" refers to a small piece of semiconducting material on which a given functional circuit is fabricated. Typically, integrated circuits are produced in large batches on a single wafer of electronic-grade silicon (EGS) or other semiconductor (such as GaAs) through processes such as photolithography. The wafer is cut (diced) into many pieces, each containing one copy of the circuit. Each of these pieces is called a die or memory die. (Search "die (integrated circuit)" on Wikipedia.com Oct. 9, 2019. Accessed Nov. 18, 2019.)

A memory die is a die, in one embodiment, that includes one or more functional circuits for operating as a non-volatile memory media and/or a non-volatile memory array. "Non-volatile memory array" refers to a set of non-volatile storage cells (also referred to as memory cells or non-volatile memory cells) organized into an array structure having rows and columns. A memory array is addressable using a row identifier and a column identifier.

"Storage cell" refers to a type of storage media configured to represent one or more binary values by way of a determinable characteristic of the storage media when the storage media is sensed, read, or detected to determine a binary value(s) stored, or represented by, the determinable characteristic of the memory cell. Storage cell and memory cell are used interchangeably herein.

"Non-volatile memory media" refers to any hardware, device, component, element, or circuit configured to maintain an alterable physical characteristic used to represent a binary value of zero or one after a primary power source is removed. Examples of the alterable physical characteristic include, but are not limited to, a threshold voltage for a transistor, an electrical resistance level of a memory cell, a current level through a memory cell, a magnetic pole orientation, a spin-transfer torque, and the like.

The alterable physical characteristic is such that, once set, the physical characteristic stays sufficiently fixed such that when a primary power source for the non-volatile memory media is unavailable the alterable physical characteristic can be measured, detected, or sensed, when the binary value is read, retrieved, or sensed. Said another way, non-volatile memory media is a storage media configured such that data stored on the non-volatile memory media) is retrievable after a power source for the non-volatile memory media is removed and then restored. Non-volatile memory media may comprise one or more non-volatile memory elements, which may include, but are not limited to: chips, packages, planes, memory die, and the like.

Examples of non-volatile memory media include but are not limited to: ReRAM, Memristor memory, programmable metallization cell memory, phase-change memory (PCM, PCME, PRAM, PCRAM, ovonic unified memory, chalcogenide RAM, or C-RAM), NAND flash memory (e.g., 2D NAND flash memory, 3D NAND flash memory), NOR flash memory, nano random-access memory (nano RAM or NRAM), nanocrystal wire-based memory, silicon-oxide based sub-10 nanometer process memory, graphene memory, Silicon-Oxide-Nitride-Oxide-Silicon (SONOS), programmable metallization cell (PMC), conductive-bridging RAM (CBRAM), magneto-resistive RAM (MRAM), magnetic storage media (e.g., hard disk, tape), optical storage media, or the like.

While the non-volatile memory media is referred to herein as "memory media," in various embodiments, the non-volatile memory media may more generally be referred to as non-volatile memory. Because non-volatile memory media is capable of storing data when a power supply is removed, the non-volatile memory media may also be referred to as a recording media, non-volatile recording media, non-volatile storage media, storage, non-volatile memory, volatile memory medium, non-volatile storage medium, non-volatile storage, or the like.

In certain embodiments, data stored in non-volatile memory media is addressable at a block level which means that the data in the non-volatile memory media is organized into data blocks that each have a unique logical address (e.g., LBA). In other embodiments, data stored in non-volatile memory media is addressable at a byte level which means that the data in the non-volatile memory media is organized into bytes (8 bits) of data that each have a unique address, such as a logical address. One example of byte addressable non-volatile memory media is storage class memory (SCM). "Non-volatile memory array" refers to a set of non-volatile storage cells (also referred to as memory cells or non-volatile memory cells) organized into an array structure having rows and columns. A memory array is addressable using a row identifier and a column identifier.

In some embodiments, each storage device 200 may include two or more memory dies 104, such as flash memory, nano random-access memory ("nano RAM or NRAM"), magneto-resistive RAM ("MRAM"), dynamic RAM ("DRAM"), phase change RAM ("PRAM"), etc. In further embodiments, the data storage device 200 may include other types of non-volatile and/or volatile data storage, such as dynamic RAM ("DRAM"), static RAM ("SRAM"), magnetic data storage, optical data storage, and/or other data storage technologies.

The storage device 200, also referred to herein as a storage device, may be a component within a host 106 as depicted in here, and may be connected using a data bus 112, such as a peripheral component interconnect express ("PCIe") bus, a Serial Advanced Technology Attachment ("serial ATA") bus, or the like. In another embodiment, the storage device 200 is external to the host 106 and is connected, a universal serial bus ("USB") connection, an Institute of Electrical and Electronics Engineers ("IEEE") 1394 bus ("FireWire"), or the like. In other embodiments, the storage device 200 is connected to the host 106 using a peripheral component interconnect ("PCI") express bus using external electrical or optical bus extension or bus networking solution such as InfiniBand or PCI Express Advanced Switching ("PCIe-AS"), or the like.

In various embodiments, the storage device 200 may be in the form of a dual-inline memory module ("DIMM"), a daughter card, or a micro-module. In another embodiment, the storage device 200 is a component within a rack-mounted blade. In another embodiment, the storage device 200 is contained within a package that is integrated directly onto a higher-level assembly (e.g., mother board, laptop, graphics processor). In another embodiment, individual components comprising the storage device 200 are integrated directly onto a higher-level assembly without intermediate packaging. The storage device 200 is described in further detail with regard to FIG. 2.

"Processor" refers to any circuitry, component, chip, die, package, or module configured to receive, interpret, decode, and execute machine instructions. Examples of a processor may include, but are not limited to, a central processing unit, a general-purpose processor, an application-specific processor, a graphics processing unit (GPU), a field programmable gate array (FPGA), Application Specific Integrated Circuit (ASIC), System on a Chip (SoC), virtual processor, processor core, and the like.

In a further embodiment, instead of being connected directly to the host 106 as DAS, the data storage device 200 may be connected to the host 106 over a data network. For example, the data storage device 200 may include a storage area network ("SAN") storage device, a network attached storage ("NAS") device, a network share, or the like. In one embodiment, the storage system 100 may include a data network, such as the Internet, a wide area network ("WAN"), a metropolitan area network ("MAN"), a local area network ("LAN"), a token ring, a wireless network, a fiber channel network, a SAN, a NAS, ESCON, or the like, or any combination of networks. A data network may also include a network from the IEEE 802 family of network technologies, such Ethernet, token ring, Wi-Fi, Wi-Max, and the like. A data network may include servers, switches, routers, cabling, radios, and other equipment used to facilitate networking between the host 106 and the data storage device 200.

The storage system 100 includes at least one host 106 connected to the storage device 200. Multiple hosts 106 may be used and may comprise a server, a storage controller of a storage area network ("SAN"), a workstation, a personal computer, a laptop computer, a handheld computer, a supercomputer, a computer cluster, a network switch, router, or appliance, a database or storage appliance, a data acquisition or data capture system, a diagnostic system, a test system, a robot, a portable electronic device, a wireless device, or the like. In another embodiment, a host 106 may be a client and the storage device 200 operates autonomously to service data requests sent from the host 106. In this embodiment, the host 106 and storage device 200 may be connected using a computer network, system bus, Direct Attached Storage (DAS) or other communication means suitable for connection between a computer and an autonomous storage device 200.

The depicted embodiment shows a user application 108 in communication with a storage client 110 as part of the host 106. In one embodiment, the user application 108 is a software application operating on or in conjunction with the storage client 110. "Storage client" refers to any hardware, software, firmware, or logic component or module configured to communicate with a storage device in order to use storage services. Examples of a storage client include, but are not limited to, operating systems, file systems, database applications, a database management system ("DBMS"), server applications, a server, a volume manager, kernel-level processes, user-level processes, applications, mobile applications, threads, processes, and the like. "Software" refers to logic implemented as processor-executable instructions in a machine memory (e.g. read/write volatile memory media or non-volatile memory media).

The storage client 110 manages files and data and utilizes the functions and features of the storage controller 102 and associated memory dies 104. Representative examples of storage clients include, but are not limited to, a server, a file system, an operating system, a database management system ("DBMS"), a volume manager, and the like. The storage client 110 is in communication with the storage controller 102 within the storage device 200. In some embodiments, the storage client 110 may include remote storage clients operating on hosts 106 or otherwise accessible via the network 116. Storage clients may include, but are not limited to operating systems, file systems, database applications, server applications, kernel-level processes, user-level processes, applications, and the like.

In one embodiment, the storage system 100 includes one or more clients connected to one or more hosts 106 through one or more computer networks 116. A host 106 may be a server, a storage controller of a SAN, a workstation, a personal computer, a laptop computer, a handheld computer, a supercomputer, a computer cluster, a network switch, router, or appliance, a database or storage appliance, a data acquisition or data capture system, a diagnostic system, a test system, a robot, a portable electronic device, a wireless device, or the like. The network 116 may include the Internet, a wide area network ("WAN"), a metropolitan area network ("MAN"), a local area network ("LAN"), a token ring, a wireless network, a fiber channel network, a SAN, network attached storage ("NAS"), ESCON, or the like, or any combination of networks. The network 116 may also include a network from the IEEE 802 family of network technologies, such Ethernet, token ring, WiFi, WiMax, and the like.

The network 116 may include servers, switches, routers, cabling, radios, and other equipment used to facilitate networking the host 106 or hosts 106 or clients. In one embodiment, the storage system 100 includes multiple hosts that communicate as peers over a network 116. In another embodiment, the storage system 100 includes multiple storage devices 200 that communicate as peers over a network 116. One of skill in the art will recognize other computer networks comprising one or more computer networks and related equipment with single or redundant connection between one or more clients or other computers with one or more storage devices 200 or one or more storage devices 200 connected to one or more hosts. In one embodiment, the storage system 100 includes two or more storage devices 200 connected through the network 116 to a host 106 without a directly connected host 106.

In one embodiment, the storage client 110 communicates with the storage controller 102 through a host interface comprising an Input/Output (I/O) interface. For example, the storage device 200 may support the ATA interface standard, the ATA Packet Interface ("ATAPI") standard, the small computer system interface ("SCSI") standard, and/or the Fibre Channel standard which are maintained by the International Committee for Information Technology Standards ("INCITS").

In certain embodiments, the storage media of a memory device is divided into volumes or partitions. Each volume or partition may include a plurality of sectors. Traditionally, a sector is 512 bytes of data. One or more sectors are organized into a block (referred to herein as both block and data block, interchangeably). "Data block" refers to a smallest physical amount of storage space on physical storage media that is accessible, and/or addressable, using a storage command. The physical storage media may be volatile memory media, non-volatile memory media, persistent storage, non-volatile storage, flash storage media, hard disk drive, or the like. Certain conventional storage devices divide the physical storage media into volumes or logical partitions (also referred to as partitions). Each volume or logical partition may include a plurality of sectors. One or more sectors are organized into a block (also referred to as a data block). In certain storage systems, such as those interfacing with the Windows® operating systems, the data blocks are referred to as clusters. In other storage systems, such as those interfacing with UNIX, Linux, or similar operating systems, the data blocks are referred to simply as blocks. A data block or cluster represents a smallest physical amount of storage space on the storage media that is managed by a storage controller. A block storage device may associate n data blocks available for user data storage across the physical storage media with a logical block address (LBA), numbered from 0 to n. In certain block storage devices, the logical block addresses may range from 0 to n per volume or logical partition. In conventional block storage devices, a logical block address maps directly to one and only one data block. "Logical block address" refers to a value used in a block storage device to associate each of n logical blocks available for user data storage across the storage media with a logical address. In certain block storage devices, the logical block addresses (LBAs) may range from 0 to n per volume or partition. In block storage devices, each LBA maps directly to a particular data block, and each data block maps to a particular set of physical sectors, or physical data block addresses on the physical storage media. "User data" refers to data that a host directs a non-volatile storage device to store or record.

In one example embodiment, a data block includes eight sectors which is 4 KB. In certain storage systems, such as those interfacing with the Windows® operating systems, the data blocks are referred to as clusters. In other storage systems, such as those interfacing with UNIX, Linux, or similar operating systems, the data blocks are referred to simply as blocks. A block or data block or cluster represents a smallest physical amount of storage space on the storage media that is managed by a storage manager, such as a storage controller, storage system, storage unit, storage device, or the like.

In some embodiments, the storage controller 102 may be configured to store data on one or more asymmetric, write-once storage media, such as solid-state storage memory cells within the memory die 104. "Write once storage media" refers to a storage media such as a storage cell that is reinitialized (e.g., erased) before new data or a change to the data is written or programmed thereon. In other words, data of a write once storage media cannot be overwritten, the write once storage media must be erased before subsequently writing data to the write once storage media. "Asymmetric storage media" refers to a storage media having different latencies for different storage operations. Many types of solid-state storage media (e.g., memory dies) are asymmetric; for example, a read operation may be much faster than a write/program operation, and a write/program operation may be much faster than an erase operation (e.g., reading the storage media may be hundreds of times faster than erasing, and tens of times faster than programming the storage media).

"Program" refers to a storage operation in which a characteristic of a memory cell is changed from a first state (often, an erased state) to a second state. A program storage operation may also be referred to as a write operation herein.

In certain embodiments, a program storage operation may include a series of iterations that incrementally change the characteristic until at least a target level of change is achieved. In other embodiments, a program storage operation may cause the attribute to change to a target level with a single iteration.

The memory die 104 may be partitioned into memory divisions that can be erased as a group (e.g., erase blocks) in order to, inter alia, account for the asymmetric properties of the memory die 104 or the like. As such, modifying a single data segment in-place may require erasing the entire erase block comprising the data, and rewriting the modified data to the erase block, along with the original, unchanged data. This may result in inefficient write amplification, which may excessively wear the memory die 104.

"Erase block" refers to a logical erase block or a physical erase block. In one embodiment, a physical erase block represents the smallest storage unit within a given memory die that can be erased at a given time (e.g., due to the wiring of storage cells on the memory die). In one embodiment, logical erase blocks represent the smallest storage unit, or storage block, erasable by a storage controller in response to receiving an erase command. In such an embodiment, when the storage controller receives an erase command specifying a particular logical erase block, the storage controller may erase each physical erase block within the logical erase block simultaneously. It is noted that physical erase blocks within a given logical erase block may be considered as contiguous within a physical address space even though they reside in separate dies. Thus, the term "contiguous" may be applicable not only to data stored within the same physical medium, but also to data stored within separate media.

Therefore, in some embodiments, the storage controller 102 may be configured to write data out-of-place. As used herein, writing data "out-of-place" refers to writing data to different media storage location(s) rather than overwriting the data "in-place" (e.g., overwriting the original physical location of the data). Modifying data out-of-place may avoid write amplification, since existing, valid data on the erase block with the data to be modified need not be erased and recopied. Moreover, writing data out-of-place may remove erasure from the latency path of many storage operations (e.g., the erasure latency is no longer part of the critical path of a write operation).

Management of a data block by a storage manager includes specifically addressing a particular data block for a read operation, write operation, or maintenance operation. "Maintenance operation" refers to an operation performed on a non-volatile storage device that is configured, designed, calibrated, or arranged to improve or extend the life of the non-volatile storage device and/or data stored thereon.

A block storage device may associate n blocks available for user data storage across the storage media with a logical address, numbered from 0 to n. In certain block storage devices, the logical addresses may range from 0 to n per volume or partition. "Logical address" refers to any identifier for referencing a memory resource (e.g., data), including, but not limited to: a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, or the like. A logical address does not indicate the physical location of data on the storage media but is an abstract reference to the data.

In conventional block storage devices, a logical address maps directly to a particular data block on physical storage media. In conventional block storage devices, each data block maps to a particular set of physical sectors on the physical storage media. However, certain storage devices do not directly or necessarily associate logical addresses with particular physical data blocks. These storage devices may emulate a conventional block storage interface to maintain compatibility with a block storage client 110.

In one embodiment, the storage controller 102 provides a block I/O emulation layer, which serves as a block device interface, or API. In this embodiment, the storage client 110 communicates with the storage device through this block device interface. In one embodiment, the block I/O emulation layer receives commands and logical addresses from the storage client 110 in accordance with this block device interface. As a result, the block I/O emulation layer provides the storage device compatibility with a block storage client 110.

In one embodiment, a storage client 110 communicates with the storage controller 102 through a host interface comprising a direct interface. In this embodiment, the storage device directly exchanges information specific to non-volatile storage devices. "Non-volatile storage device" refers to any hardware, device, component, element, or circuit configured to maintain an alterable physical characteristic used to represent a binary value of zero or one after a primary power source is removed. Examples of a non-volatile storage device include, but are not limited to, a hard disk drive (HDD), Solid-State Drive (SSD), non-volatile memory media, and the like.

A storage device using direct interface may store data in the memory die 104 using a variety of organizational constructs including, but not limited to, blocks, sectors, pages, logical blocks, logical pages, erase blocks, logical erase blocks, ECC codewords, logical ECC codewords, or in any other format or structure advantageous to the technical characteristics of the memory die 104. "Characteristic" refers to any property, trait, quality, or attribute of an object or thing. Examples of characteristics include, but are not limited to, condition, readiness for use, unreadiness for use, size, weight, composition, feature set, and the like.

The storage controller 102 receives a logical address and a command from the storage client 110 and performs the corresponding operation in relation to the memory die 104. The storage controller 102 may support block I/O emulation, a direct interface, or both.

Figure 2:
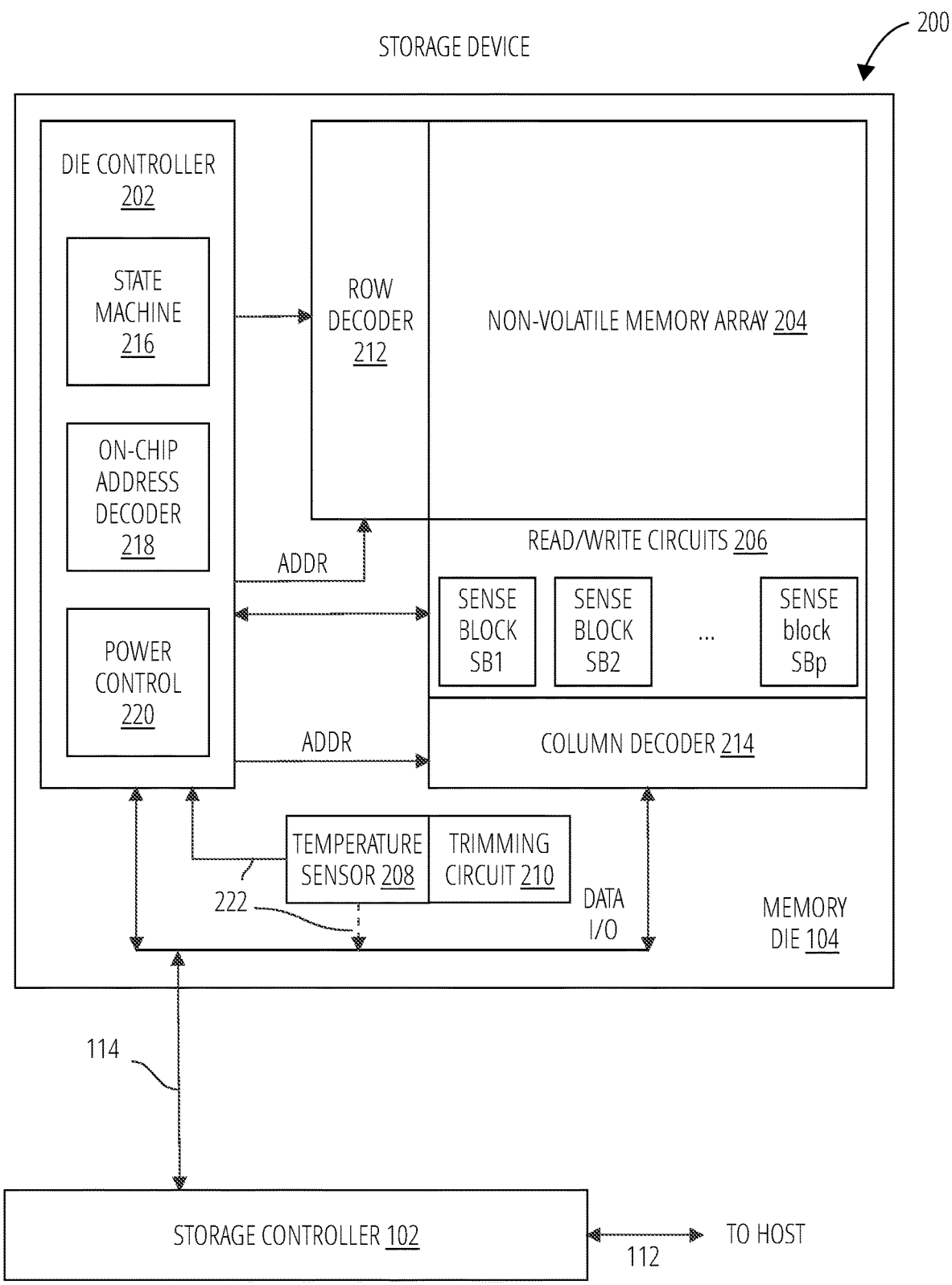
FIG. 2 illustrates a storage device 200 in accordance with one embodiment.

FIG. 2 is a block diagram of an exemplary storage device 200. "Storage device" refers to any hardware, system, sub-system, circuit, component, module, non-volatile memory media, hard disk drive, storage array, device, or apparatus configured, programmed, designed, or engineered to store data for a period of time and retain the data in the storage device while the storage device is not using power from a power supply. Examples of storage devices include, but are not limited to, a hard disk drive, FLASH memory, MRAM memory, a Solid-State storage device, Just a Bunch Of Disks (JBOD), Just a Bunch Of Flash (JBOF), an external hard disk, an internal hard disk, and the like.

The storage device 200 may include a storage controller 102 and at least one memory die 104. Each memory die 104 may include a die controller 202, at least one non-volatile memory array 204 in the form of a three-dimensional array, read/write circuits 206, a temperature sensor 208, and a trimming circuit 210.

"Die controller" refers to a set of circuits, circuitry, logic, or components configured to manage the operation of a die. In one embodiment, the die controller is an integrated circuit. In another embodiment, the die controller is a combination of discrete components. In another embodiment, the die controller is a combination of one or more integrated circuits and one or more discrete components.

"Three-dimensional memory array" refers to a physical arrangement of components of a memory array which contrasts with a two-dimensional (2-D) memory array. 2-D memory arrays are formed along a planar surface of a semiconductor wafer or other substrate. A three-dimensional (3-D) memory array extends up from the wafer surface/substrate and generally includes stacks, or columns, of memory cells extending upwards, in a z-direction. In a 3-D memory array word lines comprise layers stacked one on the other as the memory array extends upwards. Various 3-D arrangements are possible. In one arrangement a NAND string is formed vertically with one end (e.g., source) at the wafer surface and the other end (e.g., drain) on top.

"Threshold voltage" refers to a voltage level that when applied to a gate electrode of a transistor causes the transistor to conduct a current between the drain electrode and source electrode.

Consequently, a non-volatile memory array is a memory array having memory cells configured such that a characteristic (e.g., threshold voltage level, resistance level, conductivity, etc.) of the memory cell used to represent stored data remains a property of the memory cell without a requirement for using a power source to maintain the characteristic.

A memory array is addressable using a row identifier and a column identifier. Those of skill in the art recognize that a memory array may comprise the set of memory cells within a plane, the set of memory cells within a memory die, the set of memory cells within a set of planes, the set of memory cells within a set of memory die, the set of memory cells within a memory package, the set of memory cells within a set of memory packages, or with other known memory cell set architectures and configurations.

A memory array may include a set of memory cells at a number of levels of organization within a storage or memory system. In one embodiment, memory cells within a plane may be organized into a memory array. In one embodiment, memory cells within a plurality of planes of a memory die may be organized into a memory array. In one embodiment, memory cells within a plurality of memory dies of a memory device may be organized into a memory array. In one embodiment, memory cells within a plurality of storage devices of a storage system may be organized into a memory array.

The non-volatile memory array 204 is addressable by word line via a row decoder 212 and by bit line via a column decoder 214. "Bit line" refers to a circuit structure configured to deliver a voltage and/or conduct current to a column of a memory array. In one embodiment, the column comprises a NAND string or memory string and may also be referred to as channel. In one embodiment, the column is referred to as a NAND string and the NAND string comprises a channel. In one embodiment, a bit line connects to a NAND string at a drain end or drain side of the NAND string. A memory array may have one bit line for each memory cell along the word lines of the memory array. "Word line" refers to a structure within a memory array comprising a set of memory cells. The memory array is configured such that the operational memory cells of the word line are read or sensed during a read operation. Similarly, the memory array is configured such that the operational memory cells of the word line are read, or sensed, during a read operation. A word line may also be referred to as a physical page or page for short.

"Channel" refers to a structure within a memory array that extends from a source side to a drain side. In one embodiment, a channel is a vertical column within a memory array that forms a conductive path between a source line coupled to one end of a NAND string and a bit line coupled to another end of the NAND string. A channel may be formed from a variety of materials including, for example, polysilicon.

In one embodiment, a channel within a NAND string creates a conductive path by activating one or more memory cells (e.g., one or more selected memory cells and unselected memory cells) along the NAND string, and one or more control structures (e.g., select gates (source and/or drain) between a source line connected to one end (e.g., the source side) of the NAND string and a sense amplifier or bit line connected to the other end (e.g., the drain side) of the NAND string.

"Select gate" refers to a transistor structurally and/or electrically configured to function as a switch to electrically connect a first electrical structure connected to a source terminal of the transistor to a second electrical structure connected to the drain terminal. When functioning as a switch, the transistor is referred to herein as a 'select gate' and serves to gate (selectively) or control when, and in what quantity, a current flows or a voltage passes between the first electrical structure and the second electrical structure. Depending on the context, references to select gate herein may refer to the whole transistor or to the gate terminal of the transistor.

The read/write circuits 206 include multiple sense blocks SB1, SB2, . . . , SBp (sensing circuitry) and allow a page of memory cells to be read or programmed in parallel. "Circuitry" refers to electrical circuitry having at least one discrete electrical circuit, electrical circuitry having at least one integrated circuit, electrical circuitry having at least one application specific integrated circuit, circuitry forming a general purpose computing device configured by a computer program (e.g., a general purpose computer configured by a computer program which at least partially carries out processes or devices described herein, or a microprocessor configured by a computer program which at least partially carries out processes or devices described herein), circuitry forming a memory device (e.g., forms of random access memory), or circuitry forming a communications device (e.g., a modem, communications switch, or optical-electrical equipment). In certain embodiments, each memory cell across a row of the memory array together form a physical page. "Read/write circuit" refers to a device, component, element, module, system, sub-system, circuitry, logic, hardware, or circuit configured and/or operational to read data from and write data to a storage media, such as storage cells of a storage array.

A physical page may include memory cells along a row of the memory array for a single plane or for a single memory die. In one embodiment, the memory die includes a memory array made up of two equal sized planes. In one embodiment, a physical page of one plane of a memory die includes four data blocks (e.g., 16 KB). In one embodiment, a physical page (also called a "die page") of a memory die includes two planes each having four data blocks (e.g., 32 KB).

Commands and data are transferred between the host 106 and storage controller 102 via a data bus 112, and between the storage controller 102 and the one or more memory die 104 via bus 114. The storage controller 102 may comprise the logical modules described in more detail with respect to FIG. 1.

The non-volatile memory array 204 can be two-dimensional (2D—laid out in a single fabrication plane) or three-dimensional (3D—laid out in multiple fabrication planes). The non-volatile memory array 204 may comprise one or more arrays of memory cells including a 3D array. In one embodiment, the non-volatile memory array 204 may comprise a monolithic three-dimensional memory structure (3D array) in which multiple memory levels are formed above (and not in) a single substrate, such as a wafer, with no intervening substrates. The non-volatile memory array 204 may comprise any type of non-volatile memory that is monolithically formed in one or more physical levels of arrays of memory cells having an active area disposed above a silicon substrate. The non-volatile memory array 204 may be in a non-volatile solid-state drive having circuitry associated with the operation of the memory cells, whether the associated circuitry is above or within the substrate.

Word lines may comprise sections of the layers containing memory cells, disposed in layers above the substrate. Multiple word lines may be formed on single layer by means of trenches or other non-conductive isolating features.

The die controller 202 cooperates with the read/write circuits 206 to perform memory operations on memory cells of the non-volatile memory array 204, and includes a state machine 216, an address decoder 218, and a power control 220. The state machine 216 provides chip-level control of memory operations. "Die controller" refers to a set of circuits, circuitry, logic, or components configured to manage the operation of a die. In one embodiment, the die controller is an integrated circuit. In another embodiment, the die controller is a combination of discrete components. In another embodiment, the die controller is a combination of one or more integrated circuits and one or more discrete components.

The address decoder 218 provides an address interface between that used by the host or a storage controller 102 to the hardware address used by the row decoder 212 and column decoder 214. "Hardware" refers to functional elements embodied as analog and/or digital circuitry.

The power control 220 controls the power and voltages supplied to the various control lines during memory operations. "Control line" refers to a structure, circuit, circuitry, and/or associated logic configured to convey an electrical current and/or voltage from a source to a destination. In certain embodiments, analog voltages, currents, biases, and/or digital signals supplied or discharged over a control line are used to control switches, select gates, and/or other electrical components. Certain control lines may have a specific name based on what parts of a circuit the control line controls or where the control line couples, or connects, to other circuits. Examples of named control lines include word lines, bit lines, source control lines, drain control lines, and the like.

"Source control line" refers to a control line configured to operate a select gate (e.g., turn the select gate on, activate, and off, deactivate) for coupling a source side of a NAND string to a source line and/or another circuit.

"Source side" refers to the end of a NAND string or side of a three-dimensional memory array connected to the source layer or line on a memory die. The term comes from the source terminal of a field effect transistor or similar component. In a daisy-chained string of transistors, the source terminal of the first transistor may be connected to a source line, a ground or some other lower voltage line, and the drain terminal may be connected to the source terminal of the next transistor, that transistor's drain terminal may be connected to the next source terminal and so on, with the drain terminal of the final transistor connected to a higher voltage signal or power line. The gate terminal of each transistor may then control whether or not current flows through the transistor from source to drain, and through the string from source line to bit line.

"Source line" refers to a structure, circuit, circuitry, and/or associated logic configured to convey an electrical current and/or voltage from a supply to one or more channels of associated NAND strings. In certain embodiments, a source line is configured to convey a voltage to, and/or discharge a voltage from multiple NAND strings concurrently. In other embodiments, a source line is configured to convey a voltage to, and/or discharge a voltage from multiple NAND strings in series.

In certain embodiments, a source control line couples to one or more source-side select gates that are between the source line and one or more NAND strings and the source control line manages whether voltage or current passes between the source line and the NAND string. In such an embodiment, the source line may also be referred to as a common source line.

"Source-side select gate" refers to a select gate functioning as a switch to electrically connect a source line to a NAND string and/or a channel of a NAND string. Examples of source lines include source-side select gates, dummy word line select gates, and the like. In certain embodiments, a source-side select gate may comprise just source-side select gates (e.g., SGS0, SGS1, etc.). In other embodiments, a source-side select gate may comprise just dummy word line select gates (e.g., DWLS0, DWLS1, etc.). In still other embodiments, a source-side select gate may comprise both source-side select gates (e.g., SGS0, SGS1, etc.) and dummy word line select gates (e.g., DWLS0, DWLS1, etc.). A select gate positioned between the source line and the NAND string on the source side of the NAND string is referred to as a source-side select gate.

"Drain control line" refers to a control line configured to operate a select gate (e.g., turn the select gate on, activate, and off, deactivate) for coupling a drain side of a NAND string to a bit line and/or a sense circuit. "Drain side" refers to the end of a NAND string or side of a three-dimensional memory array connected to the bit line(s). The term comes from the drain terminal of a field effect transistor or similar component. In a daisy-chained string of transistors, the source terminal of the first transistor may be connected to a source line, a ground or some other lower voltage line, and the drain terminal may be connected to the source terminal of the next transistor, that transistor's drain terminal may be connected to the next source terminal and so on, with the drain terminal of the final transistor connected to a higher voltage signal or power line. The gate terminal of each transistor may then control whether or not current flows through the transistor from source to drain, and through the string from source line to bit line.

"Drain-side select gate" refers to a select gate functioning as a switch to electrically connect a bit line to a NAND string and/or a channel of a NAND string. A select gate positioned between the bit line and the NAND string on the drain side of the NAND string is referred to as a drain-side select gate.

"Logic" refers to machine memory circuits, non-transitory machine readable media, and/or circuitry which by way of its material and/or material-energy configuration comprises control and/or procedural signals, and/or settings and values (such as resistance, impedance, capacitance, inductance, current/voltage ratings, etc.), that may be applied to influence the operation of a device. Magnetic media, electronic circuits, electrical and optical memory (both volatile and nonvolatile), and firmware are examples of logic. Logic specifically excludes pure signals or software per se (however does not exclude machine memories comprising software and thereby forming configurations of matter).

The power control 220 and/or read/write circuits 206 can include drivers for word lines, source gate select (SGS) transistors, drain gate select (DGS) transistors, bit lines, substrates (in 2D memory structures), charge pumps, and source lines. In certain embodiments, the power control 220 may detect a sudden loss of power and take precautionary actions. The power control 220 may include various first voltage generators (e.g., the drivers) to generate the voltages described herein. The sense blocks can include bit line drivers and sense amplifiers in one approach.

In some implementations, some of the components can be combined. In various designs, one or more of the components (alone or in combination), other than non-volatile memory array 204, can be thought of as at least one control circuit or storage controller which is configured to perform the techniques described herein. For example, a control circuit may include any one of, or a combination of, die controller 202, state machine 216, address decoder 218, column decoder 214, power control 220, sense blocks SB1, SB2, . . . , SBp, read/write circuits 206, storage controller 102, and so forth.

The temperature sensor 208 may be implemented as circuitry within the memory die 104. In some embodiments, the temperature sensor 208 output or sensed temperature 222 (e.g., measured temperature or measured temperature code) may be sent to the storage controller 102 via the bus 114 in order to inform control of storage operations and system functionality.

The temperature sensor 208 is configured to report an accurate temperature over a range of ambient temperatures. This is accomplished using logic within the temperature sensor 208 such that for each change in degree of temperature, the temperature sensor 208 reports an accurate representation of that temperature, known herein as a temperature code (aka "Temp code"). "Temperature code" refers to an encoding of a VPTAT into a fixed length binary code. In one embodiment, a temperature code is an 8-bit binary code. The temperature code may be configured such that each value the temperature code represents corresponds to a specific degree of temperature over a predefined range. For example, in one embodiment the predefined range is temperatures between −42 degrees Celsius and 125 degrees Celsius. Each change in temperature across this predefined range is represented by a unique temperature code.

"VPTAT" refers to Voltage Proportional to Absolute Temperature. A VPTAT is a voltage that changes in direct relationship to a temperature detected, or sensed by, a temperature sensor that generates the VPTAT. In certain embodiments, a VPTAT is encoded into a temperature code. A resistive digital to analog converter (RDAC) may convert a generated VPTAT signal into a temperature code. A temperature sensor (e.g., an ideal temperature sensor) that operates with complete accuracy senses and reports a temperature code that increases one value with each degree rise in temperature and decreases one value with each degree drop in temperature.

In one embodiment, the temperature sensor 208 generates a sensed temperature 222 representative of a temperature of the temperature sensor 208. In another embodiment, the sensed temperature 222 is a temperature code and the temperature sensor 208 may include logic to convert a VPTAT generated by the temperature sensor 208 into a temperature code that represents the sensed temperature 222 and may be made available to the die controller 202 and/or the storage controller 102.

In some embodiments, the sensed temperature 222 may be sent to the die controller 202 in order to implement one embodiment of a solution disclosed herein. A trimming circuit 210 may be implemented in hardware within the memory die 104 as well. The trimming circuit 210 may be a resistive digital-to-analog converter (RDAC) or similar device and may be configured to enable trimming at one end or the other end of a qualification temperature range but may not perform analog trimming on both ends of the range.

In one embodiment, the host 106 is a computing device (e.g., laptop, desktop, smartphone, tablet, digital camera) that includes one or more processors, one or more processor readable storage devices (RAM, ROM, FLASH memory, hard disk drive, solid state memory) that store processor readable code (e.g., software) for programming the storage controller 102 to perform the methods described herein. The host may also include additional system memory, one or more input/output interfaces and/or one or more input/output devices in communication with the one or more processors, as well as other components well known in the art.

Associated circuitry typically implements operation of the memory cells and communication with the memory cells. As non-limiting examples, storage devices may have circuitry used for controlling and driving memory cells to accomplish functions such as programming and reading. This associated circuitry may be on the same substrate as the memory cells and/or on a separate substrate. For example, a storage controller for memory read-write operations may be located on a separate storage controller chip and/or on the same substrate as the memory cells.

One of skill in the art will recognize that the disclosed techniques and devices are not limited to the two-dimensional and three-dimensional exemplary structures described but covers all relevant memory structures within the spirit and scope of the technology as described herein and as understood by one of skill in the art.

Figure 3:
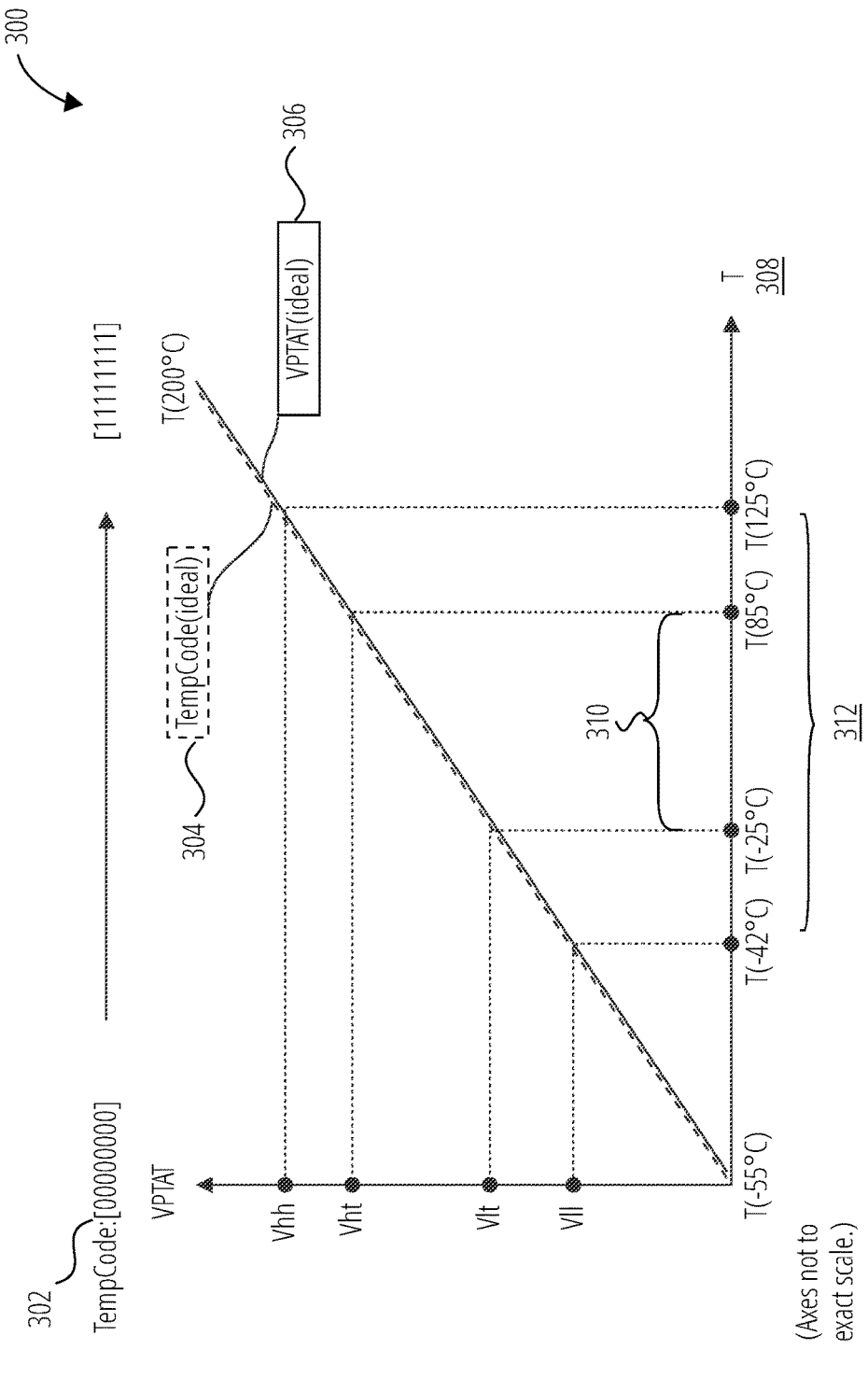
FIG. 3 illustrates an ideal temperature sensor behavior 300.

FIG. 3 illustrates ideal temperature sensor behavior 300. "Ideal temperature sensor" refers to a temperature sensor configured to report, generate, sense, or detect, a temperature and/or temperature code without any errors. A temperature register 302 may be configured to store a digital temperature code 304 (Tempcode), generated by transforming a temperature sensor output voltage 306, Voltage Proportional To Absolute Temperature (VPTAT), through an analog to digital converter.

One example of a temperature sensor circuit integrated into a semiconductor, suitable for claimed embodiments disclosed herein, is a temperature sensor with Bandgap. The temperature sensor output voltage 306 may be generated by an analog temperature sensor in such a manner that the temperature sensor output voltage 306 varies linearly with a known temperature 308, as illustrated. This direct proportional relationship is indicated by the slope of the VPTAT line on the graph of FIG. 3.

The temperature register 302 may, in one embodiment, be an 8-bit register, configured to store 256 unique binary values, from "00000000" to "11111111". The temperature register 302 may be in a storage controller 102 or a die controller 202. The analog to digital converter may be configured such that each incremental register value represents a 1 degree rise in temperature, as measured in Celsius. Thus a digital temperature code 304 of "00000000" may correspond to a value of −55° C., "00000001" may correspond to −54° C., etc., until the final value of "11111111" is reached, corresponding to 200° C. Note that this range exceeds the expected operating range of a semiconductor device, and is illustrated as an example; it is not intended to limit the disclosed solution.

For an ideal temperature sensor, the temperature sensor output voltage 306 may be used to calculate the known temperature 308 by applying a proportionality constant, represented here as "K". This proportionality constant is ideally a single, constant value determined by the physical parameters of the sensor design. Slight variations in manufacturing may be expected to result in a variation in K from one temperature sensor to another, but K for an ideal temperature sensor may be determined by taking at least two voltage measurements at two known temperatures.

K may be determined by dividing the measured voltage by the known temperature. This is represented in the illustration by K equal to Vlt divided by T(−25° C.), measured at a lowest temperature of −25° Celsius, as well as equal to Vht divided by T(85° C.), measured at a highest temperature of 85° C. These measurements may, for some silicon devices, represent the lowest and highest qualification temperatures, respectively, such that an ideal constant K may be verified across a testing or qualification temperature range 310 within the device's operational temperature range 312. Ideally, this slope K may be constant across the entire range of temperature represented by the temperature register 302, including the device's full operational temperature range. In one embodiment, the operational temperature range 312 may be from about −42° C. to about 125° C. The qualification temperature range 310 may be from about −25° C. to about 85° C., as illustrated.

Figure 4:
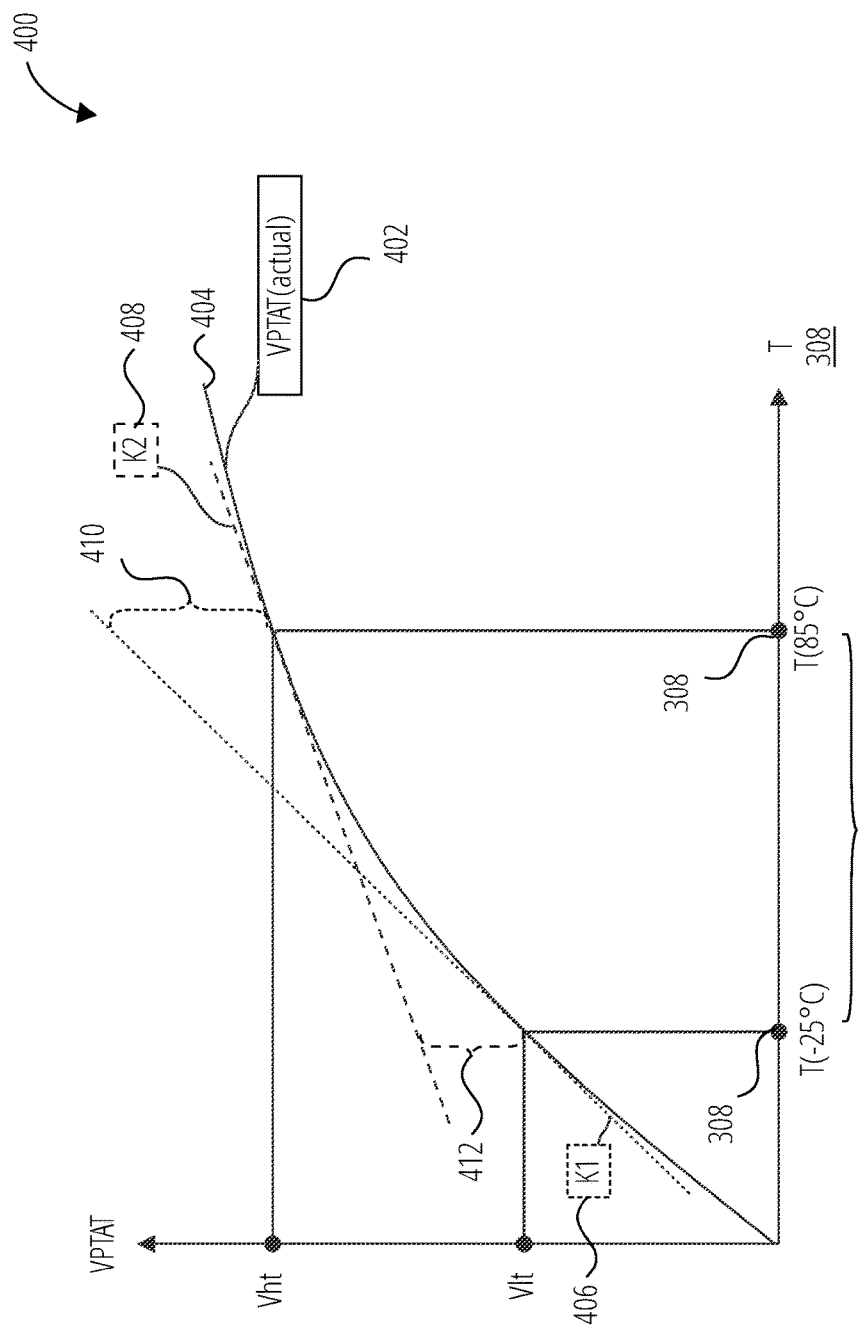
FIG. 4 illustrates an actual temperature sensor behavior 400 in accordance with one embodiment.

FIG. 4 illustrates actual temperature sensor behavior 400 in accordance with one embodiment. Rather than the ideal, linear relationship between known temperature 308 and sensor output voltage VPTAT, temperature sensor output voltage 402 VPTAT (actual) may be more accurately represented by a curve 404. This non-linear response results from the effects of temperature on the behavior of the sensor circuitry itself, due at least in part to PVT. "PVT" refers to Process variations, Voltage level differences, and Temperature differences between two fabricated semiconductor devices.

If one were to measure VPTAT at a first temperature, such as a lowest temperature of the qualification temperature range 310 T(−25° C.), sense a value of Vlt, and extrapolate the voltage to temperature relationship, based on a directly linear slope, indicated by the first slope 406 across a range of temperatures, one would incur a first temperature code error 410 when calculating the VPTAT voltage and temperature code expected at T(85° C.). First temperature code error 410 may be referred to herein as a slope error. "Slope error" refers to a measure of how far a slope of a line between a first temperature having a first temperature code and a measured temperature having a second temperature code deviates from an ideal slope of the line where the measured temperature code matches an actual temperature which would produce an ideal temperature code.

In certain embodiments, the slope error is measured with respect to a temperature along an x-axis and a VPTAT along a y-axis. In such embodiments, a slope error may be calculated by subtracting y-coordinate values and dividing that result by a difference between the x-coordinate values.

In certain embodiments, a slope error may be referred to as a temperature error because a temperature sensor may be designed based on having a direct relationship exist between the temperature and the VPTAT, or temperature code which can be represented by the slope-intercept formula $y=mx+b$, where $b=0$, $m=1$, x is the temperature and y is the VPTAT, or temperature code.

If a temperature sensor is completely accurate then each change in temperature will correlate to a change in VPTAT, or temperature code along the line represented by this slope-intercept formula. Consequently, deviations from this slope-intercept formula and line represent an error in the temperature reported by the temperature sensor. Thus, a temperature error may be determined by subtracting an ideal temperature from a measured temperature. The ideal temperature and measured temperature may be represented by temperature codes and so a temperature error may be determined by subtracting an ideal temperature code from a measured temperature code.

Similarly, if one used a second slope 408 calculated based on Vht, measured at a highest temperature of the qualification temperature range 310 T(85° C.), and infer a directly linear slope relationship, one would incur a second temperature code error 412 in calculation for T(−25° C.). Second temperature code error 412 may be referred to herein as a slope error.

Figure 5:
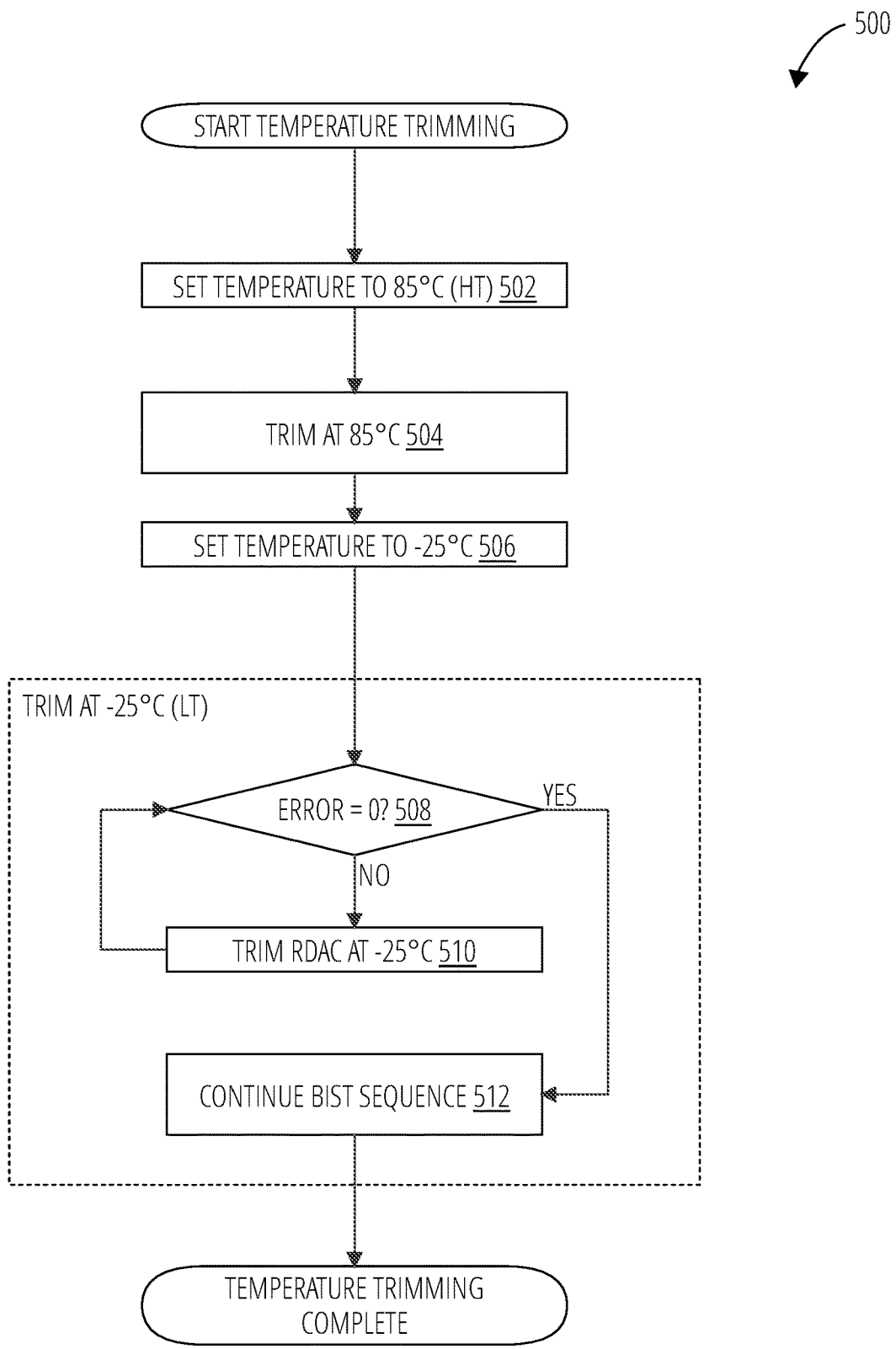
FIG. 5 illustrates a conventional correction process 500.

FIG. 5 illustrates an example conventional correction process 500. This process relies on multiple phases of hardware trimming to apply temperature code correction, and thus may take five to ten times as long to complete as the disclosed embodiments in some cases.

At block 502, the temperature of a testing chamber that includes a temperature sensor being trimmed may be set to 85° C., or some other highest temperature of a qualification temperature range. The chamber may be calibrated such that the temperature achieved in the testing chamber may be relied upon as accurate, and time may be taken to allow the entirety of the chamber and its contents to come to a stable temperature of 85° C.

A temperature sensor reading may then be taken from the temperature sensor within the chamber. As is understood in the art, the temperature sensor circuitry may be expected to provide a certain ideal output for this reading that corresponds to detecting a temperature of 85° C. The temperature sensor output read may differ from the ideal reading the temperature sensor is designed to produce due to PVT spread.

"PVT spread" refers to process variations, voltage level differences, and temperature differences between two fabricated semiconductor devices, or variations that may be experienced by the same device under different operating conditions. Process spread may occur due to differences in the manufacturing process from one wafer to another, or even from one die to another. The semiconductor manufacturing process is rigorously designed to achieve uniformity, but even minute differences in concentrations of a dopant, minute incursions of impurities, etc., may cause noticeable inconsistencies in the behavior of finished components. Temperature spread may occur due to both the difference in temperature effects in the circuitry at higher or lower die temperatures or when operating at different ambient temperatures. Voltage spread may occur due to different circuit behaviors at high or low voltages, when exposed to voltage fluctuations over time, etc. All of these effects may cause a component meeting the same theoretical design parameters to behave differently from equivalent parts, or differently in one scenario than it does in another.

At block 504, the temperature sensor is trimmed at 85° C. Trimming circuits such as conventional trimming circuit 600 illustrated in FIG. 6, may be configured at block 504 to bring the temperature sensor output readings into alignment with the ideal output signal. This is known as trimming.

At block 506, the chamber temperature may be set to −25° C., or some other lowest temperature of a qualification temperature range. Time may be taken to allow the entirety of the testing setup, including the temperature sensor to come to a stable temperature of −25° C.

A temperature sensor reading may be again be taken at −25° C., with the temperature sensor at −25° C., and compared to an expected ideal temperature reading based on the circuit design. At decision block 508, if there is no error between the expected ideal reading and the detected reading, measured reading, (error equals 0), then no action need be taken, and the device's built-in self-test (BIST) sequence may continue at block 512. Temperature trimming may then be complete.

Figure 6:
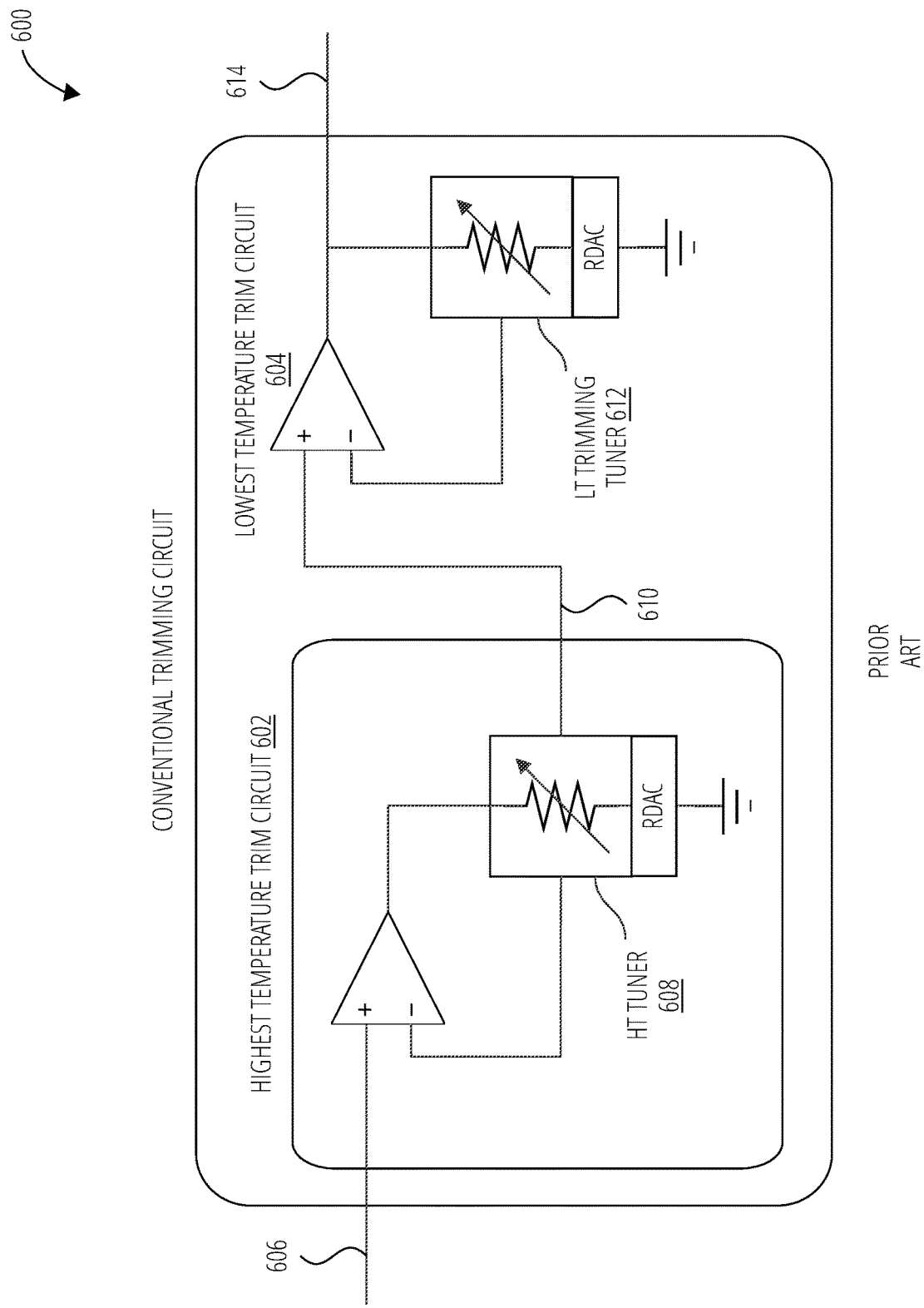
FIG. 6 illustrates a conventional trimming circuit 600.

If the temperature sensor reading at decision block 508 differs from the ideal temperature reading expected (error does not equal zero), then −25° C. trimming may be performed at block 510 using an RDAC design such as is shown in FIG. 6, similar to the process performed to trim at 85° C. The process may return to verify the temperature sensor reading now conforms to the ideal temperature reading, and trimming may be repeated until the error is zero. Once error equals zero, the BIST sequence may continue at block 512, and conventional temperature trimming is complete.

FIG. 6 illustrates a conventional trimming circuit 600. The conventional trimming circuit 600 comprises a highest temperature trim circuit 602 (e.g., a trimming circuit) and a lowest temperature trim circuit 604 (e.g., a trimming circuit).

Certain temperature sensors may include a trimming circuit for tuning the temperature sensor to correct for errors at a high end of a qualification temperature range and a trimming circuit for tuning the temperature sensor to correct for errors at a low end of the qualification temperature range. Having a trimming circuit to compensate for errors at both ends of an operating qualification temperature range may cost silicon area, fabrication costs, design costs, and may still result in temperature readings from the temperature sensor having unacceptable errors for the reported temperature. These unacceptable errors may be +/−10 degrees off of the actual temperature. "Actual temperature" refers to a temperature for a thing, object, circuit, component, or the like that is an accurate measure of a temperature of the thing, object, circuit, or component. Said another way, the actual temperature is a temperature of the thing, object, circuit, or component without any error.

After a silicon device is manufactured on die, a laser or other precision instrumentation may be used to create, disrupt, or adjust connections between microscopic on-die components. In this manner, the circuitry can be altered as needed to tune the device functionality after wafer manufacture is complete. Certain parameters may be physically calibrated or "trimmed" in this manner.

A sensor output 606 is fed to the highest temperature trim circuit 602 circuit, which may comprise an operational amplifier (OpAmp) configured with a feedback loop and a highest temperature trimming tuner 608 in the form of an RDAC. The RDAC acts as a digital potentiometer (variable resistor), allowing the voltage output of the OpAmp to be physically tuned to a desired level, which may then be produced when the sensor output 606 achieves a specific level as input to the OpAmp, as is well understood in the art. Such trimming may be done to account for maximum error conditions and/or for a highest expected temperature trimming.

"Tuner" refers to a device, component, element, circuitry, logic, hardware, or circuit configured to adjust a setting, characteristic, parameter, attribute, or the like in a manner that improves performance, accuracy, and/or operation of a set of logic, circuit, software, hardware, firmware, system, sub-system, device, apparatus, or logic unit, component, device, or component.

The highest temperature trimming tuner 608 may be used to implement trimming described in block 504 of FIG. 5 to tune temperature sensor readings at highest temperature, generating the sensor output trimmed for highest temperature 610 signal.

The sensor output trimmed for highest temperature 610 may be further trimmed for lowest temperature by the lowest temperature trim circuit 604, as described with regard to block 510 of FIG. 5, which incorporates a similar configuration of OpAmp with feedback loop and lowest temperature trimming tuner 612. The sensor output trimmed for high and low temperatures 614 may be the output of the conventional trimming circuit 600. The sensor output trimmed for high and low temperatures 614 may feed into an analog to digital encoder to generate a temperature code representative of a measured temperature.

Note that through the physical, hardware-based trimming provided by the conventional trimming circuit 600 configuration, trimming at the lowest temperature may have an impact on behavior at high temperatures in spite of highest temperature trimming having been performed, and vice versa. The trimming mechanisms at both temperatures are connected/related and may also be susceptible to on-die temperature fluctuations. Additional trimming steps may be added to improve accuracy, but each trimming step may incur a test time penalty. Thus, the conventional model of trimming at high and low temperatures may be time consuming and may have a higher slope error, even after trimming at both a highest temperature and a lowest temperature than is acceptable.

Figure 7:
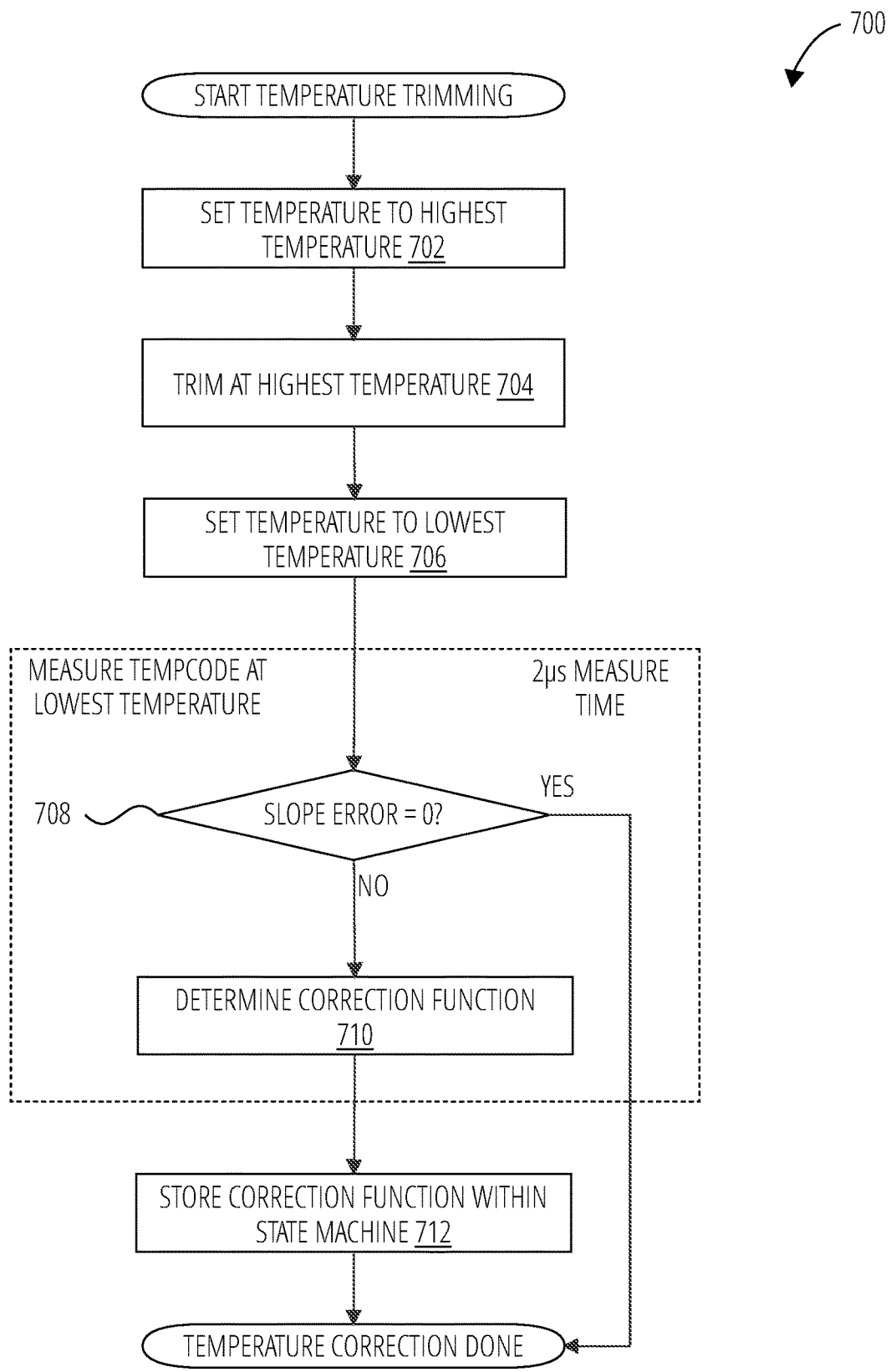
FIG. 7 illustrates a trimming process 700 in accordance with one embodiment.

FIG. 7 illustrates a trimming process 700 in accordance with one embodiment. Temperature trimming may begin at block 702 with raising a temperature of a temperature sensor to a highest temperature of a qualification temperature range having a lowest temperature and the highest temperature. As in the conventional correction process 500 introduced in FIG. 5, the temperature sensor may be positioned within a testing chamber configured to heat or cool components inside and the temperature sensor may be given time to stabilize at this highest temperature setting.

At block 704, trimming may be performed for the temperature sensor such that a high temperature code generated by the temperature sensor represents an actual temperature of the temperature sensor at the highest temperature. "High temperature code" refers to a temperature code generated by a temperature sensor when the temperature sensor senses a temperature at a highest temperature. "Highest temperature" refers to a maximum temperature within a temperature range. In one embodiment, a highest temperature is a maximum temperature represented by a whole number. In one embodiment, trimming of the temperature sensor is done by making adjustments to circuitry of the trimming circuit 210. Advantageously, the trimming circuit 210 is designed and configured such that a manufacturer can trim the high temperature code until there is no error between the high temperature code and an ideal temperature code for a given temperature. In this manner, the temperature sensor, such as temperature sensor 208, is trimmed to represent an actual temperature.

In one embodiment, the temperature sensor may include a circuit similar to the highest temperature trim circuit 602 introduced in FIG. 6. With respect to FIG. 5 and FIG. 6, trimming was discussed as modifying an analog signal output from the temperature sensor. Those of skill in the art appreciate that an analog output of the temperature sensor may be converted to a digital temperature code, by using, for example, a digital to analog conversion circuit.

In one embodiment, the temperature sensor being tested/trimmed may generate a temperature code, referred to here as a high temperature code because the measured temperature code is the temperature code provided by the temperature sensor when experiencing the highest temperature. Trimming with regard to a high temperature code may be effectively similar to trimming an analog signal, but may also involve different specific components, as is well understood in the art. Illustrations of circuitry used to implement this step are not intended to limit the scope of this disclosure.

At block 706, the temperature of the temperature sensor (e.g., by way of a testing chamber) may be lowered to the lowest temperature. This may be performed in similar manner to block 506 as described in FIG. 5. In one embodiment, the trimming process 700 may utilize conventional testing equipment up through block 706.

At decision block 708, a slope error may be determined between the high temperature code determined in block 704, and a low temperature code generated with the device set at the lowest temperature during block 706. "Low temperature code" refers to a temperature code generated by a temperature sensor when the temperature sensor senses a temperature at a lowest temperature. "Lowest temperature" refers to a minimum temperature within a temperature range. In one embodiment, a lowest temperature is a minimum temperature represented by a whole number.

This slope error may in some embodiments be generated based on relationships between an ideal temperature code slope and line and measured temperature codes discussed in regard to FIG. 4. In other embodiments, the slope error may be determined using Equation 1 below.

$$\text{slope error} = \text{INT}\left(HT + (MLT - HT) - \left(\frac{(MLT - IT)}{(HT - LT)} * (MLT - HT)\right)\right) \quad \text{Equation 1}$$

where INT is a function that returns an integer number from an input value,
HT=the high temperature code,
LT=the low temperature code,
MLT=a measured temperature code at the lowest temperature, and
IT=a temperature code for an ideal temperature sensor generating a temperature at the lowest temperature.

"Measured temperature code" refers to temperature code sensed, detected, measured, and/or calculated by a temperature sensor that is experiencing a temperature.

If the slope error determined in decision block 708 equals zero, temperature correction may be considered complete and the trimming process 700 ends. If the slope error determined is not equal to zero, the trimming process 700 continues with block 710.

At block 710, a correction function is determined that compensates for the slope error of each measured temperature code generated by the temperature sensor for temperatures across the qualification temperature range. In one embodiment, the correction function is configured to compensate for the slope error of one or more measured temperature codes generated by the temperature sensor during the temperature sensor's lifetime. In one embodiment, the correction function compensates for slope error or measurement error for each measured temperature code across the qualification temperature range and across the operational temperature range.

Notably in trimming process 700, the steps of decision block 708 and block 710 are faster than a conventional correction process 500 because there is no trimming operation after measuring the temperature code at the lowest temperature. In certain embodiments, the steps of decision block 708 and block 710 may be completed in about 2 microseconds (μs).

In one embodiment, logic, such as state machine 216, within the die controller 202 may determine the correction function. In another embodiment, logic, such as a tuner, described more below, within the die controller 202, may determine the correction function. "Correction function" refers to an expression configured to generate a corrected temperature code based on a measured temperature code. In one embodiment, the correction function is implemented in logic and applies mathematical operations to a measured temperature code such that a slope error of the measured temperature code is reduced. In another embodiment, the correction function may be implemented using hardware, firmware, software, circuitry, a device, or apparatus configured, programmed, designed, arranged, to accept the measured temperature code as an input and to output a corrected temperature code.

In one embodiment, a correction function may also, or alternatively, be referred to as a correction factor. A correction factor may be a value configured to compensate for an error in a measurement technique or measured result such as a measured temperature code. Where a correction factor is used, that correction factor may comprise a correction code (a fixed length binary code) which can be multiplied by a measured temperature code to determine a corrected temperature code.

In one embodiment, the correction function may be configured to generate a corrected temperature code based on a measured temperature code. "Corrected temperature code" refers to a temperature code, such as a measured temperature code, that has been corrected to remove some, or all, error in the temperature code due to influences from an environment and/or components used in a temperature sensor that produced the temperature code. In certain embodiments, a corrected temperature code has no error in comparison to a measured temperature code. In other embodiments, a corrected temperature code has some error in comparison to a measured temperature code, but the error is within a predefined variance range.

In certain embodiments, the correction function is configured to compensate for the slope error of each measured temperature code generated by the temperature sensor for temperatures across the qualification temperature range and/or across an operational temperature range. Where the slope error is determined using ideal operating conditions and for a qualification temperature range such as in a testing facility for a manufacturer, the correction function is configured for use during normal operation of a temperature sensor, such as temperature sensor 208, at a customer site. Advantageously, the correction function is configured to adjust/trim/tune a measured temperature code and provide a corrected temperature code during normal operations of the temperature sensor dynamically and in a digital manner each time a measured temperature code is generated or requested.

The correction function may be associated with, validated by, derived from, based at least in part on, and/or related to the formula slope error equation of Equation 1. The correction function may be represented by Equation 2.

$$\text{Corrected } Tempcode = \text{INT}\left(MOT + (MOT - HT)^* \left(\frac{(MLT - IT)}{((MLT - IT) + (HT - LT))}\right)\right) \quad \text{Equation 2}$$

where INT is a function that returns an integer number from an input value,

Corrected Tempcode=the corrected temperature code,
HT=the high temperature code,
LT=the low temperature code,
MLT=a measured temperature code at the lowest temperature,
MOT=a measured temperature code at an operating temperature within an operational temperature range, and
IT=a temperature code for an ideal temperature sensor generating a temperature at the lowest temperature. In one embodiment, the high temperature code is an ideal temperature code for a temperature sensor when that temperature sensor is at the highest temperature of a particular temperature range. In one embodiment, the low temperature code is an ideal temperature code for a temperature sensor when that temperature sensor is at the lowest temperature of a particular temperature range.

"Operating temperature" refers to a temperature at which a device, apparatus, and/or component is currently operating. "Operational temperature range" refers to a temperature range that an electronic device is expected to experience over its lifetime. An operational temperature range may be used by a manufacturer to place limits on a warranty offer.

In certain embodiments, the operational temperature range is the same as a qualification temperature range. In another embodiment, the operational temperature range is greater than a qualification temperature range on both a high end of the qualification temperature range and a low end of the qualification temperature range. In another embodiment, the operational temperature range is greater than a qualification temperature range on one end of the qualification temperature range. In another embodiment, the qualification temperature range is greater than an operational temperature range on both a high end of the operational temperature range and a low end of the operational temperature range.

In some embodiments, the correction function may be configured to generate a corrected temperature code from a measured temperature code in a manner that compensates for the slope error, and/or a temperature code error, to within a predefined variance range. This predefined variance range may be between negative two points and positive two points. Such a predefined variance range is advantageous because conventional correction processes, such as the conventional correction process 500 described in relation to FIG. 5 may correct the temperature code to within +/−10 degrees of the actual temperature. Embodiments of the claims solution provide an improvement of as much as 8 degrees more accuracy. In addition, because the trimming process 700 provides a correction function that is used during normal operation of the temperature sensor for adjusting each temperature code, the claimed solution provides a digital correction independent of a circuit architecture used for the temperature sensor.

"Predefined variance range" refers to a range for an acceptable amount that a value may deviate from an ideal or completely accurate value. The predefined variance range may define a low value and a high value before a tolerance level, or specification, is no longer satisfied. In certain embodiments, changes in values for a predefined variance range may be expressed in integer values and may be referred to as points because they may not be associated directly with a unit of measure.

At block 712, the correction function may be stored within a state machine, such as the state machine 216 introduced in FIG. 2. The correction function may be stored in a ROM fuse for use by a controller in tuning a temperature code measured by the temperature sensor. The state machine 216 may also be implemented in a die controller. Trimming adjustments using the trimming process 700 may now be considered complete.

In certain embodiments, the trimming process 700 may begin at block 702 by measuring a first temperature code with a temperature sensor having a first temperature. Optionally, or alternatively, the trimming process 700 may include setting the temperature of the temperature sensor to the first temperature.

An ideal temperature code may be determined with the temperature sensor having the first temperature. "Ideal temperature code" refers to a temperature code without any errors. The ideal temperature code accurately reflects an actual temperature being sensed by a temperature sensor. A first temperature code error may then be determined between the first temperature code and the ideal temperature code by determining a difference between the first temperature code and the ideal temperature code. At block 704, the temperature sensor may be adjusted such that the first temperature code error is zero. In this manner, the temperature sensor is accurate at the first temperature.

The trimming process 700 may continue at block 706 by measuring a second temperature code with the temperature sensor having a second temperature. Optionally, or alternatively, the trimming process 700 may include setting the temperature of the temperature sensor to the second temperature.

At decision block 708, the ideal temperature code with the temperature sensor having the second temperature may be determined, along with a second temperature code error between the second temperature code and the ideal temperature code for the second temperature. If the second temperature code error equals zero, the trimming process 700 may be complete after decision block 708.

If the second temperature code error does not equal zero, the trimming process 700 may continue at block 710 with determining a correction function in response to the second temperature code error being nonzero. At block 712, the correction function may be stored in a ROM fuse for use by a controller in tuning a temperature code measured by the temperature sensor. "Controller" refers to a hardware, device, component, element, circuitry, logic, or circuit configured to manage and control operation of another software, hardware, firmware, system, sub-system, device, apparatus, or logic unit, component, device, or component. In some embodiments, the correction function may be configured to tune the temperature code to satisfy a predefined variance range. The predefined variance range may be between negative two points and positive two points.

In digitalizing the temperature sensor output and correcting errors in the temperature code digitally, the disclosed solution eliminates the need for trimming at both ends of a qualification temperature range. Not trimming a temperature sensor at one end of a qualification temperature range saves testing/trimming/qualification time. The amount of test time saved for a single temperature sensor may be considered small, but since each semiconductor chip that includes a temperature sensor may need to be tested and trimmed, these saves add up when a manufacturer trims thousands or millions of temperature sensors. In addition, if analog hardware used in low temperature trimming is retained on the circuit, such hardware may be repurposed for other analog trimming needs, or may be eliminated completely, thereby saving space on the device.

Further, conventional analog trimming at both ends of the qualification temperature range may in some instances reintroduce errors at the first trimmed point. For example, if trimming is done at the highest temperature, reducing the high temperature slope error to zero, trimming at the lowest temperature may in some cases introduce circuit effects that may work to induce additional errors at high temperatures. Trimming at the highest temperature and correcting errors at the lowest temperature digitally may provide more accuracy in correction across the qualification temperature range (the disclosed method may incur errors within a predefined variance range of +/−2 degrees, whereas conventional solutions may incur errors of +/−10 degrees). In addition, highest temperature trimming with digital error correction may avoid inducing the hardware effects of subsequent lowest temperature trimming.

Figure 8:
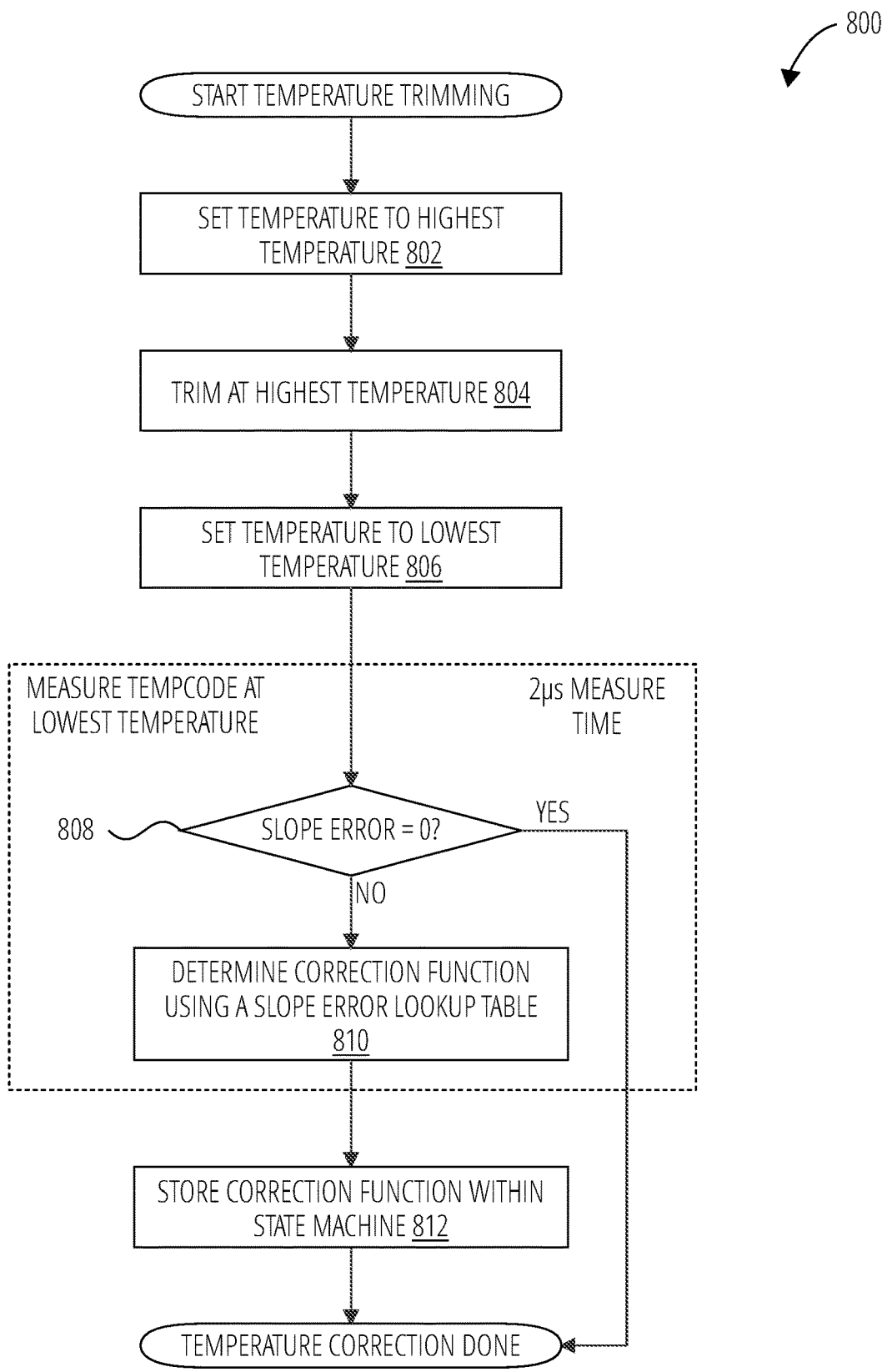
FIG. 8 illustrates a trimming process 800 in accordance with one embodiment.

FIG. 8 illustrates a trimming process 800 in accordance with one embodiment. The trimming process 800 may operate functionally similar to the trimming process 700 introduced in FIG. 7. Block 802, block 804, block 806, and decision block 808 correspond to and may be performed as previously described for block 702, block 704, block 706, and decision block 708 respectively.

At decision block 808, the slope error is determined. If the slope error is zero, the trimming process 800 may be considered complete.

If the slope error is nonzero, the trimming process 800 continues with block 810. At block 810, the determined slope error is used to search a slope error lookup table. "Slope error lookup table" refers to a repository such as a data structure configured to store a slope error and a correction function that corresponds to the slope error. In certain embodiments, the slope error lookup table is indexed by slope error and stores a plurality of slope error and correction function pairs. The slope error lookup table may be implemented using a variety of data structures including, but not limited to, an array or an associative array. A correction function may be located in the slope error lookup table using the slope error as a search key.

The correction function determined in block 810 may in block 812 be stored within a state machine, similar to FIG. 7. At this point, the trimming process 800 may be considered complete.

Figure 9:
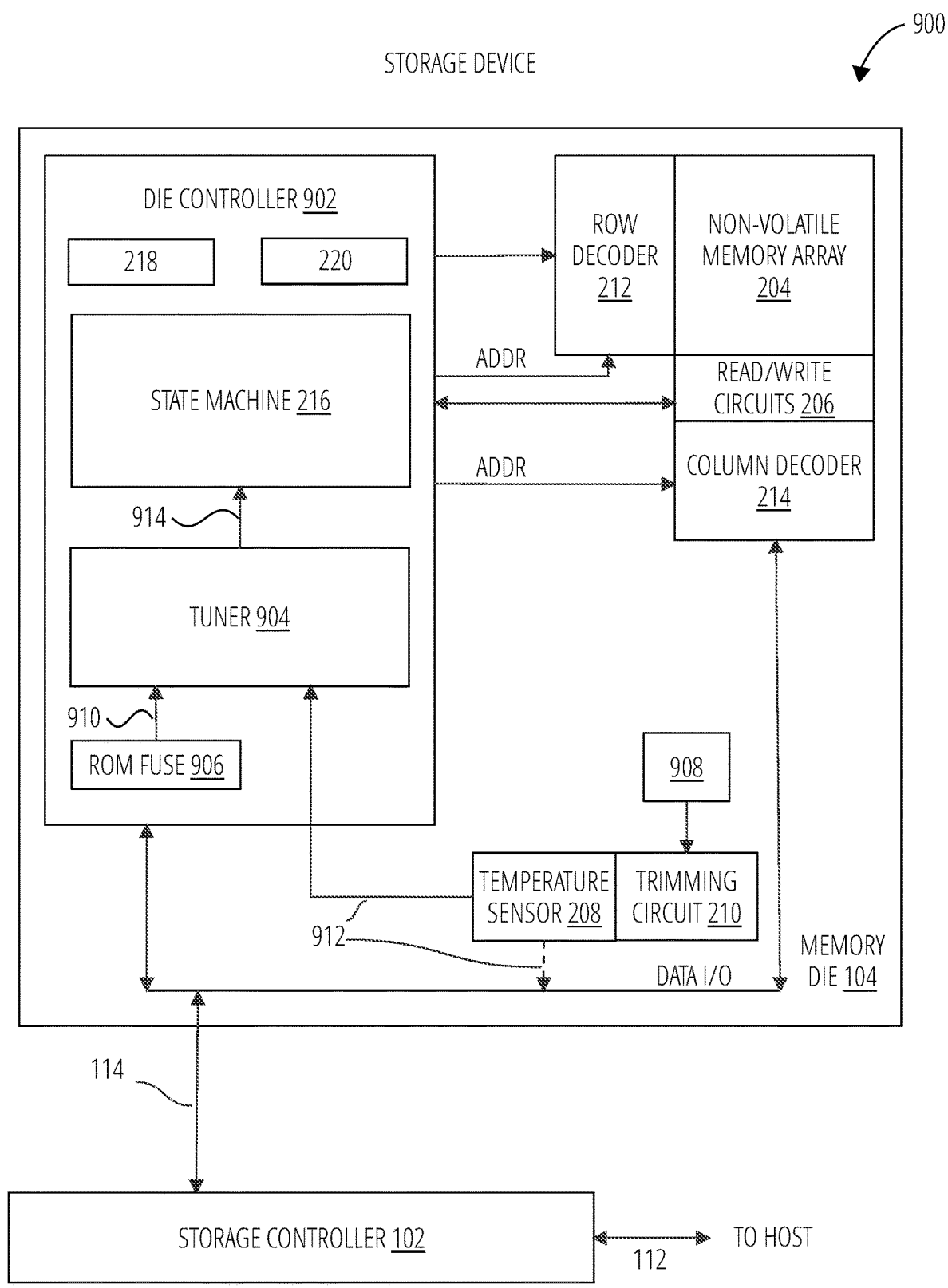
FIG. 9 illustrates a storage device 900 in accordance with one embodiment.

FIG. 9 illustrates a storage device 900 in accordance with on embodiment. In many respects, the storage device 900 may be functionally similar to the storage device 200 introduced in FIG. 2, and analogous components retain the numbering introduced in that figure.

As disclosed herein, the storage device 900 may comprise a three-dimensional memory array of storage cells in the form of a non-volatile memory array 204 and a die controller 902 configured to execute storage operations with the storage cells.

The storage device 900 may also comprise a temperature sensor 208 configured to determine a measured temperature code 912 proportional to a temperature sensed by the temperature sensor 208, as well as a trimming circuit 210 to perform hardware calibration or trimming on the output of the temperature sensor 208. The trimming circuit 210 may trim a temperature code or a VPTAT which is later converted to a temperature code.

In one embodiment, the output of the temperature sensor 208 is a measured temperature code 912. In one embodiment, the trimming circuit 210 is configured to trim output of the temperature sensor 208 such that the output fits an accepted starting point for temperature code at a given temperature. A temperature code from the temperature sensor 208 at the accepted starting point is a baseline temperature code 908.

"Baseline temperature code" refers to a temperature code that is trimmed to serve as a point of reference in calculating a slope error. In one embodiment, a baseline temperature code is determined by adjusting, trimming, and/or configuring a temperature sensor such that a measured temperature code represents a temperature that matches an actual temperature at a point in time, where the trimming and adjustments remove error from the measured temperature code. After a trimming or adjustment operation, the trimmed measured temperature code comprises the baseline temperature code.

In one embodiment, the baseline temperature code 908 may be the high temperature code trimmed by the trimming circuit 210 when the memory die 104 is at the highest temperature of the temperature sensor's qualification temperature range.

In one embodiment, the trimming circuit 210 is an analog circuit configured to be used in conjunction with a tuner 904 for trimming the measured temperature code 912 digitally in relation to a baseline temperature code 908.

The storage device 900 may further include the tuner 904 configured to generate a corrected temperature code 914 by evaluating a correction function 910 using the measured temperature code 912. The correction function may be based at least in part on, or be related to, a slope error between a measured temperature code 912 at the highest temperature of the qualification temperature range and a measured temperature code 912 at a lowest temperature of the qualification temperature range.

In certain embodiments, the tuner 904 serves as a digital tuner because tuner 904 correct each measured temperature code 912 provided by the temperature sensor 208. The tuner 904 in one embodiment may be configured to generate a corrected temperature code 914 by multiplying or adding a correction function 910, embodied as a correction factor, by a measured temperature code 912 from the temperature sensor 208.

In certain embodiments, the tuner 904 is configured to process the measured temperature code 912 in real-time, bit-by-bit, as the temperature sensor 208 generates the measured temperature code 912. Advantageously, logic of the tuner 904, in one embodiment, is configured to operate in parallel with the temperature sensor 208. As the temperature sensor 208 generates each bit of the measured temperature code 912 the tuner 904 is processing that bit and converting the bit, if needed, to create the corrected temperature code 914. This parallel processing is referred to herein as cascading decoding and thus the tuner 904 may comprise a cascading decoder, in one embodiment.

"Cascading decoder" refers to a device, component, circuit, system, logic, chip, or circuitry configured to decode multiple bits of a multi-bit input in successive stages such that each stage decodes one of the bits of the multi-bit input. In a cascading decoder, a first stage may decode a most significant bit, second stage may decode a second most significant bit, and so forth until a last stage decodes a least significant bit. In certain embodiments, each stage implements a specific logic function, or calculation.

The correction function 910 may be stored in a ROM fuse 906, and the tuner 904 may retrieve the correction function 910 from there. "ROM fuse" refers to a storage location for data that is read only when a device that includes the ROM fuse is used by a customer. A ROM fuse may be referred to as read-only memory. Data, including logic, such as executable machine instructions or expressions, may be stored in a ROM fuse by a manufacturer as a semiconductor device is manufactured. While a manufacturer may be able to write data to a ROM fuse an end user cannot. A ROM fuse may also be referred to as one-time-programmable (OTP) memory.

The baseline temperature code 908 may comprise an adjustment based on the measured temperature code 912 at a highest temperature of a qualification temperature range such that the baseline temperature code 908 has no error between the measured temperature code 912 and an ideal temperature code.

The die controller 902 may be configured to use the corrected temperature code 914 provided by the tuner 904 as input data for a temperature sensitive operation. "Temperature sensitive operation" refers to an operation, such as a storage operation, for example, that is sensitive to changes in temperature meaning a change in temperature results in a change in the performance of the operation that is undesirable. Examples of temperature sensitive operations include a read operation for NAND memory, a program, or write operation for NAND memory, a program verify operation for NAND memory, an erase verify operation for NAND memory, and the like. In some embodiments, the corrected temperature code 914 may be provided to the storage controller 102 via the bus 114 for use in operations controlled by the storage controller 102. In certain embodiments, the temperature sensor 208 provides a corrected temperature code 914 periodically, such as every second or every hour. In another embodiment, the temperature sensor 208 provides a corrected temperature code 914 in response to a command or request from the die controller 902 and/or storage controller 102.

One of skill in the art will recognize that the disclosed techniques and devices are not limited to the exemplary structures illustrated but covers all relevant memory structures within the spirit and scope of the technology as described herein and as understood by one of skill in the art. The circuits used to implement this disclosure may be incorporated into any of the modules which comprise the memory die 104 and the die controller 902. Embodiments of this claimed solution may be understood to be independent of, and not limited by, any specific temperature sensor architecture.

Figure 10:
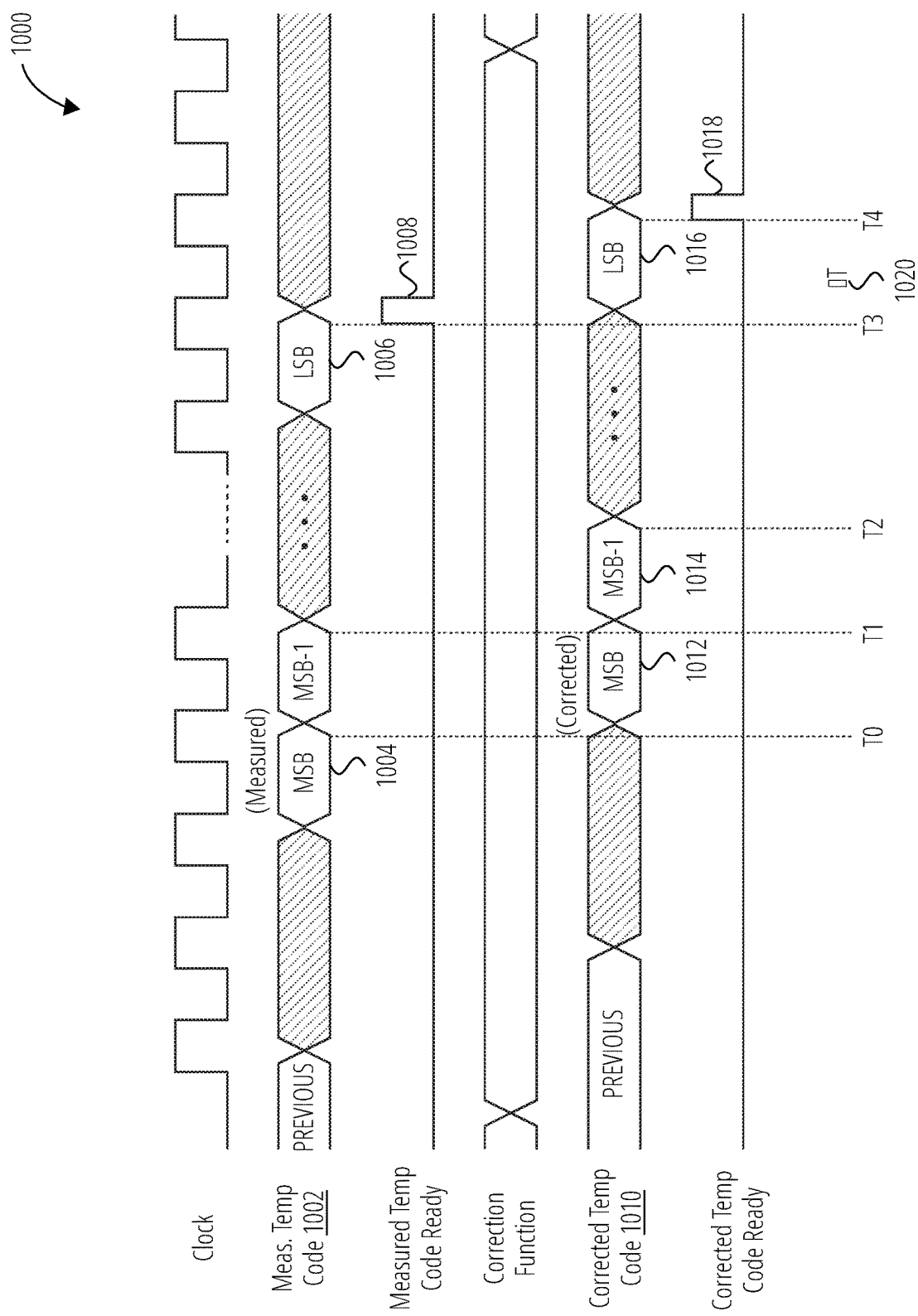
FIG. 10 illustrates a temperature correction timing diagram 1000 in accordance with one embodiment.

FIG. 10 illustrates temperature correction timing diagram 1000 in accordance with one embodiment. The temperature sensor may be configured to communicate each bit of the measured temperature code 1002 in sequential order to a decoder, such as the tuner 904, introduced in FIG. 9. The temperature sensor may send the most significant bit 1004 (MSB 1004) of the measured temperature code 1002 first and end with the least significant bit 1006 (LSB 1006) of the measured temperature code 1002.

In conventional solutions, the measured temperature code 1002 may be transmitted to the state machine or tuner with one bit latched in per rising clock edge. A measured temperature code ready pulse 1008 may be generated when the last bit, the least significant bit 1006 of the measured temperature code 1002, is latched into the state machine, indicating to other functional logic modules that the entire measured temperature code 1002 is ready for use/processing.

In contrast, embodiments of the claimed solution, process each bit of the measured temperature code 1002 as each bit is ready. Embodiments of the claimed solution do not wait for all of the bits of the measured temperature code 1002 to be ready before processing. In order to reduce latency, and to correct the temperature code with minimal delay, the corrected temperature code 1010 may be calculated bit-wise with cascaded decoding, using the correction function (or a correction factor), as each bit of the measured temperature code 1002 is received. A tuner such as, tuner 904 illustrated in FIG. 9, may comprise a cascading decoder.

In the illustrated example embodiment, at time T0, the temperature sensor 208 has generated the most significant bit 1004 and communicated the most significant bit 1004 to the tuner 904. At time T1, the most significant bit 1004 has been corrected, if needed, to generate corrected MSB 1012. Also, at time T1, the temperature sensor 208 has generated the next most significant bit, MSB-1, and communicated the next most significant bit, MSB-1, to the tuner 904.

At time T1, the tuner 904 has corrected, if needed, the next most significant bit, MSB-1, to generate corrected MSB-1 1014. Also, at time T1, the temperature sensor 208 has generated the next most significant bit, MSB-2, and communicated the next most significant bit, MSB-2, to the tuner 904. This process of transferring and correcting bit continues until the least significant bit 1006 is transferred prior to time T3. Between time T3 and T4, the tuner 904 generates the corrected LSB 1016.

In this manner, such a tuner may be configured to evaluate the measured temperature code 1002 sequentially, one bit at a time, as the temperature sensor communicates each bit of the measured temperature code 1002. The tuner may also apply the correction function to each received bit of the measured temperature code 1002 sequentially. In this manner, the corrected temperature code 1010 may be determined, at least in part, in parallel with receipt of the bits of the measured temperature code 1002 by the tuner.

In one embodiment, the determination/calculation for each bit may take a single clock cycle, such that the corrected MSB 1012 of the corrected temperature code 1010 is available on the next clock rising edge after receiving the most significant bit 1004 of the measured temperature code 1002. Similarly, the final, corrected LSB 1016 Of the corrected temperature code 1010 is also available one clock cycle after the least significant bit 1006 of the measured temperature code 1002 is received. A corrected temperature code ready pulse 1018 similar to the measured temperature code ready pulse 1008 may be used in some embodiments to indicate that the corrected temperature code 1010 is ready for use by other circuits such as the state machine 216, die controller 902, or storage controller 102.

Thus, control circuitry using the temperature code may experience a delay of ΔT, a single clock delay 1020, in using the corrected temperature code 1010 instead of the measured temperature code 1002. The ΔT added to operational latency by using the corrected temperature code 1010 may in this manner be kept as low as a single clock cycle during storage operations, which may take many more clock cycles to complete, rendering the delay of a single clock cycle negligible.

Figure 11:
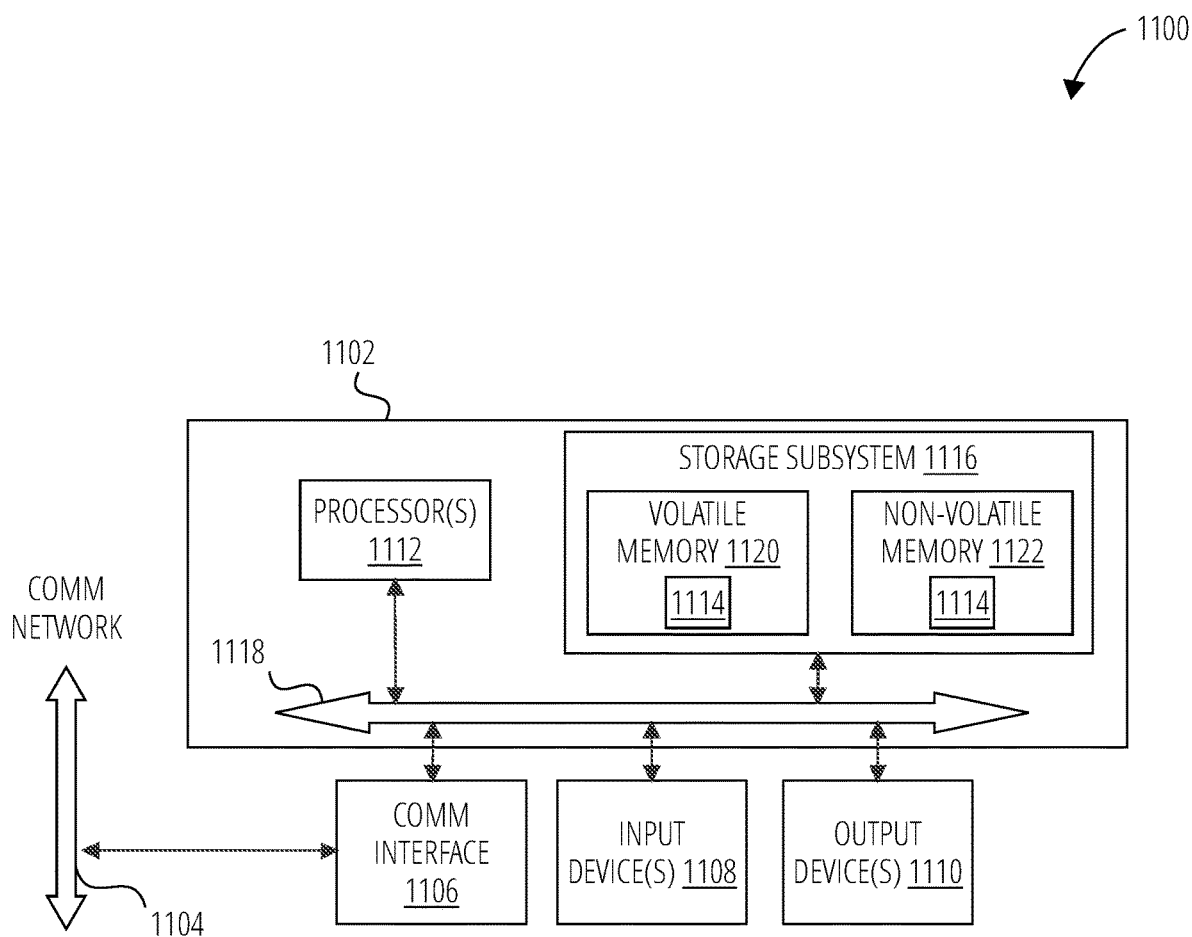
FIG. 11 is an example block diagram of a computing device 1100 that may incorporate certain embodiments.

FIG. 11 is an example block diagram of a computing device 1100 that may incorporate embodiments of the solution. FIG. 11 is merely illustrative of a machine system to carry out aspects of the technical processes described herein and does not limit the scope of the claims. One of ordinary skill in the art would recognize other variations, modifications, and alternatives. In certain embodiments, the computing device 1100 includes a data processing system 1102, a communication network 1104, communication network interface 1106, input device(s) 1108, output device(s) 1110, and the like.

As depicted in FIG. 11, the data processing system 1102 may include one or more processor(s) 1112 and a storage subsystem 1116. "Processor" refers to any circuitry, component, chip, die, package, or module configured to receive, interpret, decode, and execute machine instructions. "Instructions" refers to symbols representing commands for execution by a device using a processor, microprocessor, controller, interpreter, or other programmable logic. Broadly, 'instructions' can mean source code, object code, and executable code. "Instructions" herein is also meant to include commands embodied in programmable read-only memories (EPROM) or hard coded into hardware (e.g., "micro-code") and like implementations wherein the instructions are configured into a machine read-only memory or other hardware component at manufacturing time of a device. Examples of a processor may include, but are not limited to, a central processing unit, a general-purpose processor, an application-specific processor, a graphics processing unit (GPU), a field programmable gate array (FPGA), Application Specific Integrated Circuit (ASIC), System on a Chip (SoC), virtual processor, processor core, and the like.

The processor(s) 1112 communicate with a number of peripheral devices via a bus subsystem 1118. These peripheral devices may include input device(s) 1108, output device(s) 1110, communication network interface 1106, and the storage subsystem 1116. The storage subsystem 1116, In one embodiment, comprises one or more storage devices and/or one or more memory devices.

"Storage device" or "memory device" refers to any hardware, system, sub-system, circuit, component, module, non-volatile memory media, hard disk drive, storage array, device, or apparatus configured, programmed, designed, or engineered to store data for a period of time and retain the data in the storage device while the storage device is not using power from a power supply. Examples of storage devices include, but are not limited to, a hard disk drive, FLASH memory, MRAM memory, a Solid-State storage device, Just a Bunch Of Disks (JBOD), Just a Bunch Of Flash (JBOF), an external hard disk, an internal hard disk, and the like.

"Non-volatile memory media" refers to any hardware, device, component, element, or circuit configured to maintain an alterable physical characteristic used to represent a binary value of zero or one after a primary power source is removed. Examples of the alterable physical characteristic include, but are not limited to, a threshold voltage for a transistor, an electrical resistance level of a memory cell, a current level through a memory cell, a magnetic pole orientation, a spin-transfer torque, and the like.

The alterable physical characteristic is such that, once set, the physical characteristic stays sufficiently fixed such that when a primary power source for the non-volatile memory media is unavailable the alterable physical characteristic can be measured, detected, or sensed, when the binary value is read, retrieved, or sensed. Said another way, non-volatile memory media is a storage media configured such that data stored on the non-volatile memory media is retrievable after a power source for the non-volatile memory media is removed and then restored. Non-volatile memory media may comprise one or more non-volatile memory elements, which may include, but are not limited to: chips, packages, planes, memory die, and the like.

Examples of non-volatile memory media include but are not limited to: ReRAM, Memristor memory, programmable metallization cell memory, phase-change memory (PCM, PCME, PRAM, PCRAM, ovonic unified memory, chalcogenide RAM, or C-RAM), NAND FLASH memory (e.g., 2D NAND FLASH memory, 3D NAND FLASH memory), NOR FLASH memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), programmable metallization cell (PMC), conductive-bridging RAM (CBRAM), magneto-resistive RAM (MRAM), magnetic storage media (e.g., hard disk, tape), optical storage media, or the like.

While the non-volatile memory media is referred to herein as "memory media," in various embodiments, the non-volatile memory media may more generally be referred to as non-volatile memory. Because non-volatile memory media is capable of storing data when a power supply is removed, the non-volatile memory media may also be referred to as a recording media, non-volatile recording media, storage media, storage, non-volatile memory, volatile memory medium, non-volatile storage medium, non-volatile storage, or the like.

In certain embodiments, data stored in non-volatile memory media is addressable at a block level which means that the data in the non-volatile memory media is organized into data blocks that each have a unique logical address (e.g., LBA). In other embodiments, data stored in non-volatile memory media is addressable at a byte level which means that the data in the non-volatile memory media is organized into bytes (8 bits) of data that each have a unique address, such as a logical address. One example of byte addressable non-volatile memory media is storage class memory (SCM).

In one embodiment, the storage subsystem 1116 includes a volatile memory 1120 and a non-volatile memory 1122. The volatile memory 1120 and/or the non-volatile memory 1122 may store computer-executable instructions that alone or together form logic 1114 that when applied to, and executed by, the processor(s) 1112 implement embodiments of the processes disclosed herein.

"Volatile memory" refers to a shorthand name for volatile memory media. In certain embodiments, volatile memory refers to the volatile memory media and the logic, controllers, processor(s), state machine(s), and/or other periphery circuits that manage the volatile memory media and provide access to the volatile memory media.

"Volatile memory media" refers to any hardware, device, component, element, or circuit configured to maintain an alterable physical characteristic used to represent a binary value of zero or one for which the alterable physical characteristic reverts to a default state that no longer represents the binary value when a primary power source is removed or unless a primary power source is used to refresh the represented binary value. Examples of volatile memory media include but are not limited to dynamic random-access memory (DRAM), static random-access memory (SRAM), double data rate random-access memory (DDR RAM) or other random-access solid-state memory.

While the volatile memory media is referred to herein as "memory media," in various embodiments, the volatile memory media may more generally be referred to as volatile memory.

"Non-volatile memory" refers to shorthand name for non-volatile memory media. In certain embodiments, non-volatile memory media refers to the non-volatile memory media and the logic, controllers, processor(s), state machine(s), and/or other periphery circuits that manage the non-volatile memory media and provide access to the non-volatile memory media.

"Logic" refers to machine memory circuits, non-transitory machine readable media, and/or circuitry which by way of its material and/or material-energy configuration comprises control and/or procedural signals, and/or settings and values (such as resistance, impedance, capacitance, inductance, current/voltage ratings, etc.), that may be applied to influence the operation of a device. Magnetic media, electronic circuits, electrical and optical memory (both volatile and nonvolatile), and firmware are examples of logic. Logic specifically excludes pure signals or software per se (however does not exclude machine memories comprising software and thereby forming configurations of matter).

"Circuitry" refers to electrical circuitry having at least one discrete electrical circuit, electrical circuitry having at least one integrated circuit, electrical circuitry having at least one application specific integrated circuit, circuitry forming a general purpose computing device configured by a computer program (e.g., a general purpose computer configured by a computer program which at least partially carries out processes or devices described herein, or a microprocessor configured by a computer program which at least partially carries out processes or devices described herein), circuitry forming a memory device (e.g., forms of random access memory), or circuitry forming a communications device (e.g., a modem, communications switch, or optical-electrical equipment).

The input device(s) 1108 include devices and mechanisms for inputting information to the data processing system 1102. These may include a keyboard, a keypad, a touch screen incorporated into a graphical user interface, audio input devices such as voice recognition systems, microphones, and other types of input devices. In various embodiments, the input device(s) 1108 may be embodied as a computer mouse, a trackball, a track pad, a joystick, wireless remote, drawing tablet, voice command system, eye tracking system, and the like. The input device(s) 1108 typically allow a user to select objects, icons, control areas, text and the like that appear on a graphical user interface via a command such as a click of a button or the like.

The output device(s) 1110 include devices and mechanisms for outputting information from the data processing system 1102. These may include a graphical user interface, speakers, printers, infrared LEDs, and so on, as well understood in the art. In certain embodiments, a graphical user interface is coupled to the bus subsystem 1118 directly by way of a wired connection. In other embodiments, the graphical user interface couples to the data processing system 1102 by way of the communication network interface 1106. For example, the graphical user interface may comprise a command line interface on a separate computing device 1100 such as desktop, server, or mobile device.

The communication network interface 1106 provides an interface to communication networks (e.g., communication network 1104) and devices external to the data processing system 1102. The communication network interface 1106 may serve as an interface for receiving data from and transmitting data to other systems. Embodiments of the communication network interface 1106 may include an Ethernet interface, a modem (telephone, satellite, cable, ISDN), (asynchronous) digital subscriber line (DSL), Fire-Wire, USB, a wireless communication interface such as Bluetooth or WiFi, a near field communication wireless interface, a cellular interface, and the like.

The communication network interface 1106 may be coupled to the communication network 1104 via an antenna, a cable, or the like. In some embodiments, the communication network interface 1106 may be physically integrated on a circuit board of the data processing system 1102, or in some cases may be implemented in software or firmware, such as "soft modems", or the like.

The computing device 1100 may include logic that enables communications over a network using protocols such as HTTP, TCP/IP, RTP/RTSP, IPX, UDP and the like.

The volatile memory 1120 and the non-volatile memory 1122 are examples of tangible media configured to store computer readable data and instructions to implement various embodiments of the processes described herein. Other types of tangible media include removable memory (e.g., pluggable USB memory devices, mobile device SIM cards), optical storage media such as CD-ROMS, DVDs, semiconductor memories such as flash memories, non-transitory read-only-memories (ROMS), battery-backed volatile memories, networked storage devices, and the like. The volatile memory 1120 and the non-volatile memory 1122 may be configured to store the basic programming and data constructs that provide the functionality of the disclosed processes and other embodiments thereof that fall within the scope of the claimed solution.

Logic 1114 that implements one or more parts of embodiments of the solution may be stored in the volatile memory 1120 and/or the non-volatile memory 1122. Logic 1114 may be read from the volatile memory 1120 and/or non-volatile memory 1122 and executed by the processor(s) 1112. The volatile memory 1120 and the non-volatile memory 1122 may also provide a repository for storing data used by the logic 1114.

The volatile memory 1120 and the non-volatile memory 1122 may include a number of memories including a main random access memory (RAM) for storage of instructions and data during program execution and a read-only memory (ROM) in which read-only non-transitory instructions are stored. The volatile memory 1120 and the non-volatile memory 1122 may include a file storage subsystem providing persistent (non-volatile) storage for program and data files. The volatile memory 1120 and the non-volatile memory 1122 may include removable storage systems, such as removable FLASH memory.

The bus subsystem 1118 provides a mechanism for enabling the various components and subsystems of data processing system 1102 communicate with each other as intended. Although the communication network interface 1106 is depicted schematically as a single bus, some embodiments of the bus subsystem 1118 may utilize multiple distinct busses.

It will be readily apparent to one of ordinary skill in the art that the computing device 1100 may be a device such as a smartphone, a desktop computer, a laptop computer, a rack-mounted computer system, a computer server, or a tablet computer device. As commonly known in the art, the computing device 1100 may be implemented as a collection of multiple networked computing devices. Further, the computing device 1100 will typically include operating system logic (not illustrated) the types and nature of which are well known in the art.

Terms used herein should be accorded their ordinary meaning in the relevant arts, or the meaning indicated by their use in context, but if an express definition is provided, that meaning controls.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc., are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

What is claimed is:

1. A method, comprising:
    raising a temperature of a temperature sensor to a highest temperature of a qualification temperature range having a lowest temperature and the highest temperature;
    trimming the temperature sensor such that a high temperature code generated by the temperature sensor represents an actual temperature of the temperature sensor at the highest temperature;
    lowering the temperature of the temperature sensor to the lowest temperature;
    determining a slope error between the high temperature code and a low temperature code generated by the temperature sensor having the lowest temperature, wherein the slope error is determined with respect to a difference between a highest temperature slope and a lowest temperature slope; and
    determining a correction function that compensates for the slope error of each measured temperature code generated by the temperature sensor for temperatures across the qualification temperature range.

2. The method of claim 1, wherein the correction function is configured to compensate for the slope error of each measured temperature code generated by the temperature sensor for temperatures across the qualification temperature range and across an operational temperature range.

3. The method of claim 1, wherein the slope error comprises:

$$\text{slope error} = \text{INT}\left(HT + (MLT - HT) - \left(\frac{(MLT - IT)}{(HT - LT)} * (MLT - HT)\right)\right)$$

where INT is a function that returns an integer number from an input value,
HT=the high temperature code,
LT=the low temperature code,
MLT=a measured temperature code at the lowest temperature, and
IT=a temperature code for an ideal temperature sensor generating a temperature at the lowest temperature.

4. The method of claim 1, wherein determining the slope error comprises:
    searching a slope error lookup table based on a measured temperature code at the lowest temperature; and
    determining the slope error as a predefined slope error stored as an entry in the slope error lookup table in response to locating the entry in the slope error lookup table for the measured temperature code.

5. The method of claim 1, wherein the correction function is configured to generate a corrected temperature code based on a measured temperature code and wherein the correction function comprises:

$$\text{Corrected Tempcode} = \text{INT}\left(MOT + (MOT - HT)^* \left(\frac{(MLT - IT)}{((MLT - IT) + (HT - LT))}\right)\right)$$

where INT is a function that returns an integer number from an input value,
Corrected Tempcode=the corrected temperature code,
HT=the high temperature code,
LT=the low temperature code,
MLT=a measured temperature code at the lowest temperature,
MOT=a measured temperature code at an operating temperature within an operational temperature range, and
IT=a temperature code for an ideal temperature sensor generating a temperature at the lowest temperature.

6. The method of claim 1, wherein the correction function is configured to generate a corrected temperature code from a measured temperature code and wherein the correction function is configured to compensate for the slope error to within a predefined variance range.

7. The method of claim 6, further comprising storing the correction function in a die controller and wherein the predefined variance range is between negative two points and positive two points.

8. An apparatus, comprising:
a die controller configured to execute storage operations with storage cells;
a temperature sensor configured to determine a measured temperature code proportional to a temperature sensed by the temperature sensor;
a trimming circuit configured to calibrate the measured temperature code in accordance with a baseline temperature code;
a tuner configured to generate a corrected temperature code by evaluating a correction function using the measured temperature code, the correction function based on a slope error between a measured temperature code at a highest temperature of a qualification temperature range and a measured temperature code at a lowest temperature of the qualification temperature range, wherein the slope error is determined with respect to a difference between a highest temperature stop and a lowest temperature slope; and
wherein the die controller is configured to use the corrected temperature code for a temperature sensitive operation.

9. The apparatus of claim 8, wherein the slope error comprises:

$$\text{slope error} = \text{INT}\left(HT + (MLT - HT) - \left(\frac{(MLT - IT)}{(HT - LT)} * (MLT - HT)\right)\right)$$

where INT is a function that returns an integer number from an input value,
HT=a high temperature code measured at the highest temperature,
LT=a low temperature code measured at the lowest temperature,
MLT=a temperature code measured at the lowest temperature, and
IT=a temperature code for an ideal temperature sensor generating a temperature at the lowest temperature.

10. The apparatus of claim 8, wherein the correction function comprises:

$$\text{Corrected Tempcode} = \text{INT}\left(MOT + (MOT - HT)^* \left(\frac{(MLT - IT)}{((MLT - IT) + (HT - LT))}\right)\right)$$

where INT is a function that returns an integer number from an input value,
Corrected Tempcode=the corrected temperature code,
HT=a high temperature code measured at the highest temperature,
LT=a low temperature code measured at the lowest temperature,
MLT=the measured temperature code at the lowest temperature,
MOT=a measured temperature code at an operating temperature within an operational temperature range, and
IT=a temperature code for an ideal temperature sensor generating a temperature at the lowest temperature.

11. The apparatus of claim 10, wherein the operational temperature range comprises between about −42 degrees Celsius and about 125 degrees Celsius and the qualification temperature range comprises between about −25 degrees Celsius and about 85 degrees Celsius.

12. The apparatus of claim 8, wherein the baseline temperature code comprises an adjustment based on the measured temperature code at a highest temperature of a qualification temperature range such that the baseline temperature code has no error between the measured temperature code and an ideal temperature code.

13. The apparatus of claim 8, wherein the temperature sensor is configured to communicate each bit of the measured temperature code to the tuner in sequential order starting with a most significant bit and ending with a least significant bit of the measured temperature code.

14. The apparatus of claim 8, wherein the tuner is configured to evaluate the correction function sequentially one bit at a time as the temperature sensor communicates each bit of the measured temperature code to the tuner.

15. The apparatus of claim 8, wherein the tuner comprises a cascading decoder configured to evaluate each bit of a measured temperature code in sequential order starting with a most significant bit and ending with a least significant bit and apply the correction function to each bit of the measured temperature code such that the corrected temperature code is determined, at least in part, in parallel with receipt of bits of the measured temperature code by the tuner.

16. A method, comprising:
measuring a first temperature code with a temperature sensor having a first temperature;
determining an ideal temperature code with the temperature sensor having the first temperature;
determining a first temperature code error between the first temperature code and the ideal temperature code;
adjusting the temperature sensor such that the first temperature code error is zero;
measuring a second temperature code with the temperature sensor having a second temperature;
determining the ideal temperature code with the temperature sensor having the second temperature;

determining a second temperature code error between the second temperature code and the ideal temperature code for the second temperature;

determining a correction function in response to the second temperature code error being nonzero, wherein the correction function compensates for a slope error that is determined with respect to a difference between a first temperature slope and a second temperature slope; and storing the correction function in a ROM fuse for use by a controller in tuning a temperature code measured by the temperature sensor.

17. The method of claim 16, further comprising setting the temperature of the temperature sensor to the first temperature and setting the temperature of the temperature sensor to the second temperature.

18. The method of claim 16, wherein the first temperature code error comprises a difference between the first temperature code and the ideal temperature code.

19. The method of claim 16, wherein the correction function is configured to tune the temperature code to satisfy a predefined variance range.

20. The method of claim 19, wherein the predefined variance range is between negative two points and positive two points.

* * * * *